(12) United States Patent
Matsuoka et al.

(10) Patent No.: US 7,591,601 B2
(45) Date of Patent: Sep. 22, 2009

(54) COATER/DEVELOPER, COATING/DEVELOPING METHOD, AND STORAGE MEDIUM

(75) Inventors: Nobuaki Matsuoka, Koshi (JP); Takahiro Hashimoto, Koshi (JP); Katsuhiro Tsuchiya, Tokyo (JP); Shinichi Hayashi, Koshi (JP); Yasushi Hayashida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/107,496

(22) Filed: Apr. 22, 2008

(65) Prior Publication Data
US 2008/0266532 A1 Oct. 30, 2008

(30) Foreign Application Priority Data
Apr. 27, 2007 (JP) .............................. 2007-119416

(51) Int. Cl.
*G03D 5/00* (2006.01)
*G03B 27/32* (2006.01)
*G03F 7/00* (2006.01)

(52) U.S. Cl. .................... 396/611; 355/27; 430/325; 118/66

(58) Field of Classification Search ................. 396/571, 396/611; 430/325; 355/27; 118/66, 69
See application file for complete search history.

(56) References Cited

U.S. PATENT DOCUMENTS

| | | | |
|---|---|---|---|
| 6,126,703 A * | 10/2000 | Akimoto et al. ............ 29/25.01 |
| 7,267,497 B2 | 9/2007 | Akimoto et al. | |
| 7,322,756 B2 * | 1/2008 | Akimoto et al. ............ 396/611 |
| 2006/0165408 A1 | 7/2006 | Akimoto et al. | |
| 2008/0268383 A1* | 10/2008 | Matsuoka et al. ........... 430/324 |

FOREIGN PATENT DOCUMENTS

JP 2006-203075 8/2006

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

A coater/developer is disclosed that includes a heating module having a pair of rotary bodies configured to rotate about respective horizontal axles, the rotary bodies being spaced apart from each other in a direction along the conveyance path of a substrate so that the rotational axles thereof are parallel to each other; a conveyance path member engaged with and extended between the rotary bodies so as to move along an orbit, the conveyance path member forming a part of the conveyance path of the substrate placed on the conveyance path member; a first transfer part provided at the upstream end of the conveyance path; a second transfer part provided at the downstream end of the conveyance path; and a heating part provided between the upstream end and the downstream end of the conveyance path and configured to heat the substrate.

20 Claims, 18 Drawing Sheets

COATER/DEVELOPER, COATING/DEVELOPING METHOD, AND STORAGE MEDIUM

BACKGROUND OF THE INVENTION

1. Field of the Invention

The present invention relates to a coater/developer (coating and developing apparatus) and a coating/developing method (coating and developing method) that apply resist liquid onto a substrate such as a semiconductor wafer or an LCD substrate (glass substrate for a liquid crystal display) and develop the resist film after its exposure to light, and a storage medium.

2. Description of the Related Art

In a semiconductor device or LCD substrate manufacturing process, a resist pattern is formed on a substrate with a technique called photolithography. This technique is implemented by a series of processes that forms a liquid film on the surface of a substrate such as a semiconductor wafer (hereinafter referred to as "wafer") by coating the surface with resist liquid and develops the resist film after exposing the resist film to light using a photomask, thereby obtaining a desired pattern.

In general, such processing is performed using a resist pattern forming apparatus having a coater/developer that applies and develops resist liquid and an exposure unit connected to the coater/developer. In order to further increase the processing speed of the coater/developer, Japanese Laid-Open Patent Application No. 2006-203075 proposes a configuration that increases the throughput of the coater/developer by increasing conveyance efficiency by reducing a workload on conveyance means by vertically arranging an area for storing modules before exposure and an area for storing modules after exposure relative to each other and providing each area with conveyance means.

According to this technique, for example, as shown in FIG. 1, a carrier block S1', a processing block S2', and an interface block S3' are laterally connected in this order, and the processing block S2' is formed by stacking development blocks B1' and B2' that perform development, a coating block B4' that applies resist liquid, and anti-reflection film forming blocks B3' and B5' that form corresponding anti-reflection films before and after application of the resist liquid, respectively. In each of the blocks B1' through B5' of the processing block S2', there are provided a liquid processing part for performing liquid processing such as development, application of resist liquid, or application of chemical liquid for forming an anti-reflection film; multiple shelf units in which processing units for performing pre-processing and post-processing of the liquid processing are arranged in multiple tiers; and a corresponding one of conveyance means A1' through A5' conveying a wafer W between the liquid processing part and each part of the shelf units. Further, there are also provided dedicated transfer arms that transfer the wafer W among the blocks B1' through B5'.

By conveying the wafer W to the processing block S2' with a transfer arm C provided in the carrier block S1' and conveying the wafer W to predetermined processing units using conveyance means A1' through A5' and the transfer arms, the workloads on the transfer arm C', conveyance means A1' through A5', and the transfer arms are reduced so as to improve the throughput of the entire apparatus.

With such an apparatus, it is possible to ensure, for example, a throughput of approximately 180 wafers per hour. However, there is a market demand for apparatuses that further increase throughput to approximately 200 to 250 wafers per hour, and studies have been made by the inventors of the present invention of development of apparatuses that ensure such high throughput.

In the above-described apparatus, the shelf units provided in each of the development blocks B1' and B2' include processing units such as a heating unit called a post-exposure baking module or the like that heats the wafer W after exposure, a cooling unit for adjusting the wafer W to a predetermined temperature after processing in the heating unit, a heating unit called a post-baking module or the like that heats the wafer W after development so as to dry the wafer W, and a temperature adjusting unit for adjusting the wafer W to a predetermined temperature after processing in this heating unit.

For example, an apparatus that has a heating plate and a cooling plate and transfers the wafer W between the main arm A1' or A2' and the heating plate with the cooling plate, thereby performing heating and cooling in a single unit is employed as each of the heating units. In this case, the wafer W is transferred to and the wafer W after heating is transferred (received) from the heating units with the main arms A1' and A2' of the development units B1' and B2'.

Compared with other blocks such as the resist liquid coating block B4', the development blocks B1' and B2' have a large number of processing units performing processing on the wafer W before and after development as described above so as to have a heavy workload imposed on their main arms A1' and A2' that transfer/receive the wafer W to/from these processing units and the development unit. As a result, the processing rates of the development blocks B1' and B2' become rate-determining with respect to the other blocks B3' through B5', which is considered to be a cause of a decrease in the throughput of the entire apparatus. Therefore, studies have been made by the inventors of the present invention for achieving high throughput of the entire apparatus by improving the throughput of the development blocks B1' and B2'.

SUMMARY OF THE INVENTION

According to one embodiment of the present invention, there is provided a technique capable of improving throughput in a coater/developer.

According to one embodiment of the present invention, there is provided a coater/developer and a coating/developing method in which the above-described problem may be solved or reduced.

According to one embodiment of the present invention, there is provided a coater/developer forming a coating film on a substrate in a first unit block provided at a stage subsequent to a carrier block into which the substrate has been carried with a carrier; thereafter conveying the substrate to an exposure unit through an interface block provided at a stage subsequent to the first unit block; and performing development in a second unit block on the substrate subjected to exposure in the exposure unit and returned therefrom through the interface block, and transferring the substrate to the carrier block, the second unit block being stacked on the first unit block and having a conveyance path of the substrate from the interface block to the carrier block, wherein the second unit block includes a development module configured to perform the development on the substrate, a heating module configured to heat the substrate before and after the development, a cooling module configured to cool the substrate after the heating, and a substrate conveyance part configured to transfer the substrate to and receive the substrate from the modules, and the heating module includes a pair of rotary bodies configured to rotate about respective horizontal axles, the rotary bodies being spaced apart from each other in a direction along the conveyance path of the substrate so that the rotational axles thereof are parallel to each other; a conveyance path member engaged with and extended between the rotary bodies so as to move along an orbit, the conveyance path member forming a part of the conveyance path of the substrate placed on the conveyance path member; a first transfer part provided at an upstream end of the conveyance path and configured to transfer the substrate between the substrate conveyance part and the conveyance path member; a second transfer part provided at a downstream end of the conveyance path and configured to transfer the substrate between the substrate conveyance part and the conveyance path member; and a heating part provided between the upstream end and the downstream end of the conveyance path and configured to heat the substrate.

According to one embodiment of the present invention, there is provided a coating and developing method forming a coating film on a substrate in a first unit block provided at a stage subsequent to a carrier block into which the substrate has been carried with a carrier; thereafter conveying the substrate to an exposure unit through an interface block provided at a stage subsequent to the first unit block; performing development in a second unit block on the substrate subjected to exposure in the exposure unit and returned therefrom through the interface block, and transferring the substrate to the carrier block, the second unit block being stacked on the first unit block and having a conveyance path of the substrate from the interface block to the carrier block, wherein the second unit block includes a development module configured to perform the development on the substrate, a heating module configured to heat the substrate before and after the development, a cooling module configured to cool the substrate after the heating, and a substrate conveyance part configured to transfer the substrate to and receive the substrate from the modules, the heating module includes a pair of rotary bodies configured to rotate about respective horizontal axles, the rotary bodies being spaced apart from each other in a direction along the conveyance path of the substrate so that the rotational axles thereof are parallel to each other; and a conveyance path member engaged with and extended between the rotary bodies so as to move along an orbit, the conveyance path member forming a part of the conveyance path of the substrate placed on the conveyance path member, and the coating and developing method includes the steps of transferring the substrate from the substrate conveyance part onto the conveyance path member through a first transfer part provided at an upstream end of the conveyance path; heating the substrate while moving the substrate to a downstream side with the conveyance path member; moving the substrate to a second transfer part provided at a downstream end of the conveyance path and transferring the substrate from the conveyance path member to the substrate conveyance part; and causing the conveyance path member without the substrate placed thereon to move along the orbit to return from the second transfer part to the first transfer part.

According to one embodiment of the present invention, there is provided a storage medium storing a computer program used in a coater/developer forming a coating film on a substrate received from a carrier block and performing development on the substrate after exposure, wherein the program contains a group of steps so as to execute the coating and developing method as set forth above.

According to one aspect of the present invention, in a heating module provided in a unit block for development, substrates are successively transferred from the substrate conveyance part of the unit block for development to the first transfer part of the heating module, and the substrates are successively moved to the downstream side. The substrates are heated while the substrates are being moved, and the heated substrates are successively transferred to the substrate conveyance part through the second transfer part of the heating module. Therefore, in the heating module, it is possible to heat the substrates in a flow process, so that it is possible to successively heat multiple substrates without interruption. Accordingly, it is possible to increase throughput. Further, a single heating module is accessed by the substrate conveyance part at two points, that is, the first transfer part and the second transfer part. Accordingly, the workload on the substrate conveyance part is reduced, so that it is possible to increase throughput.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given first, with reference to the accompanying drawings, of an embodiment of the present invention.

Figure 1:
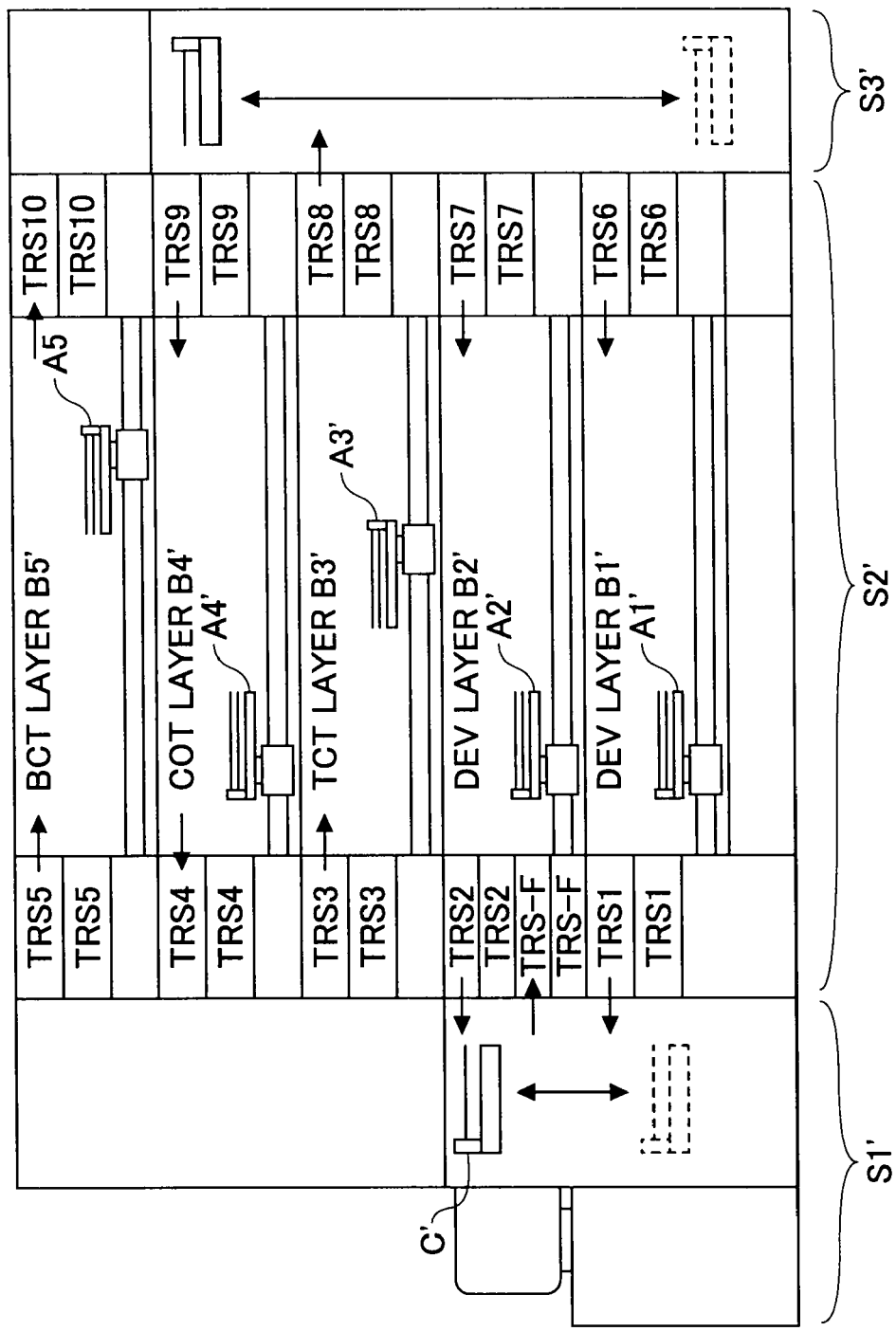
FIG. 1 is a side cutaway view showing a conventional coater/developer.
Figure 2:
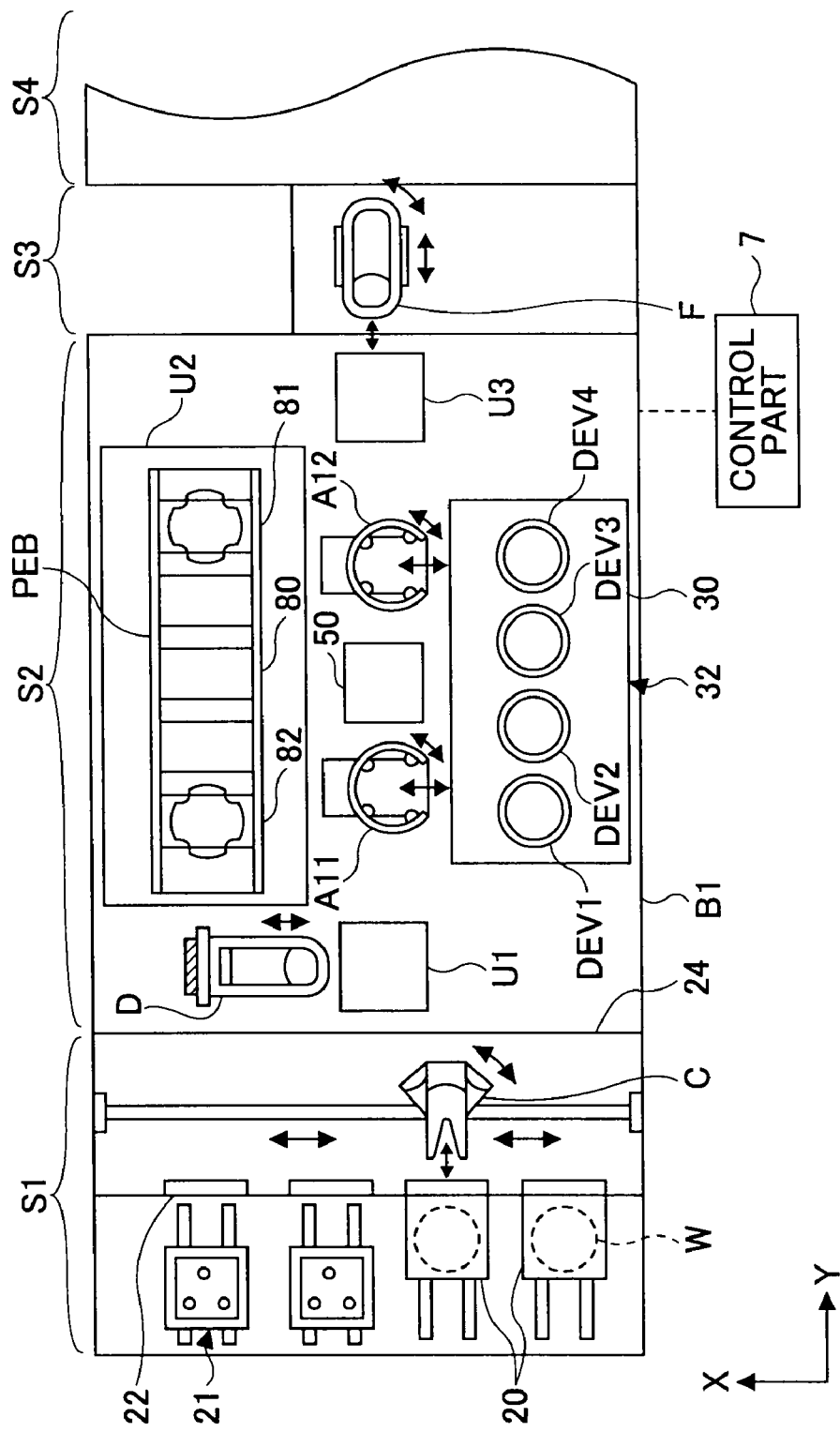
FIG. 2 is a cutaway plan view of a coater/developer according to an embodiment of the present invention.
Figure 3:
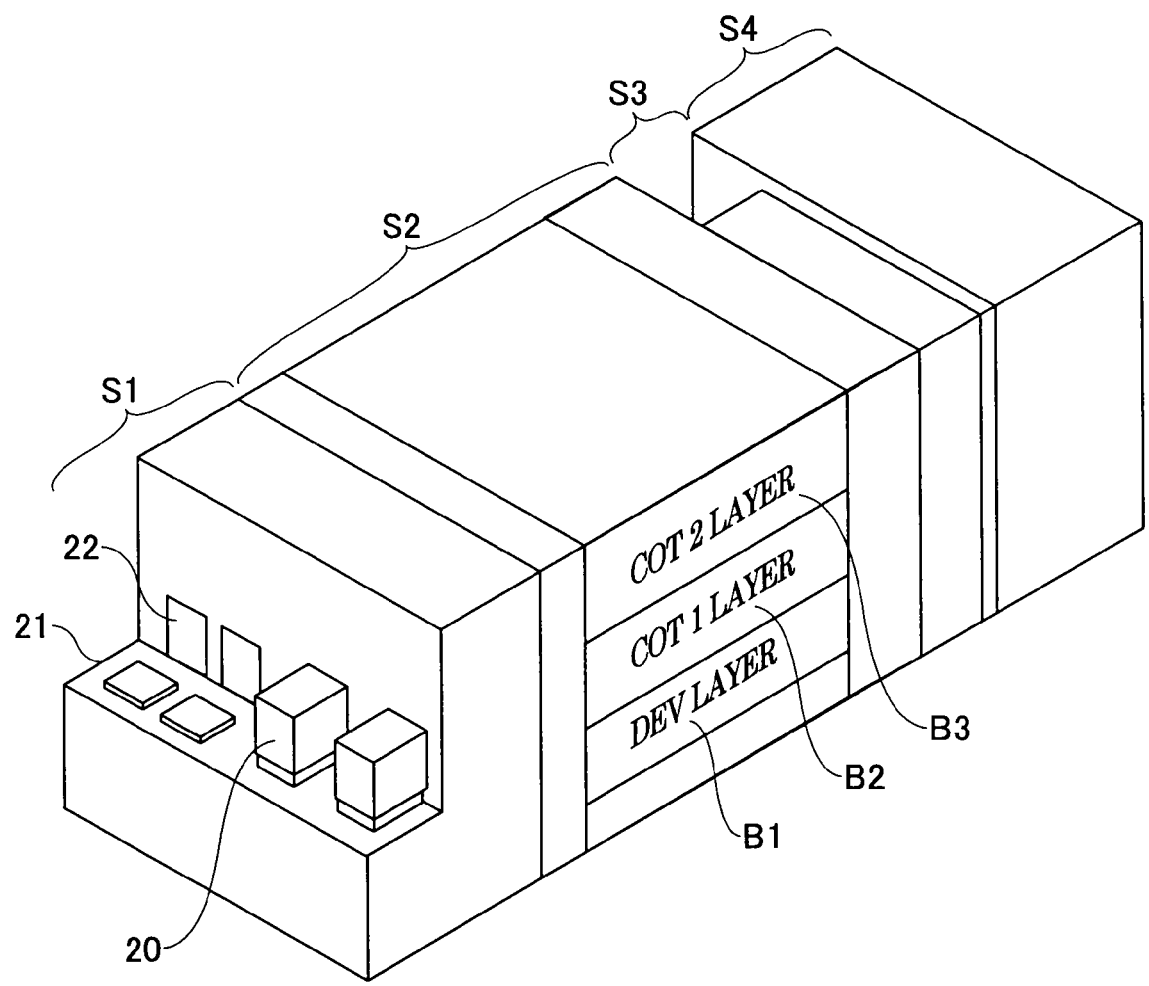
FIG. 3 is a schematic perspective view of the coater/developer according to the embodiment of the present invention.
Figure 4:
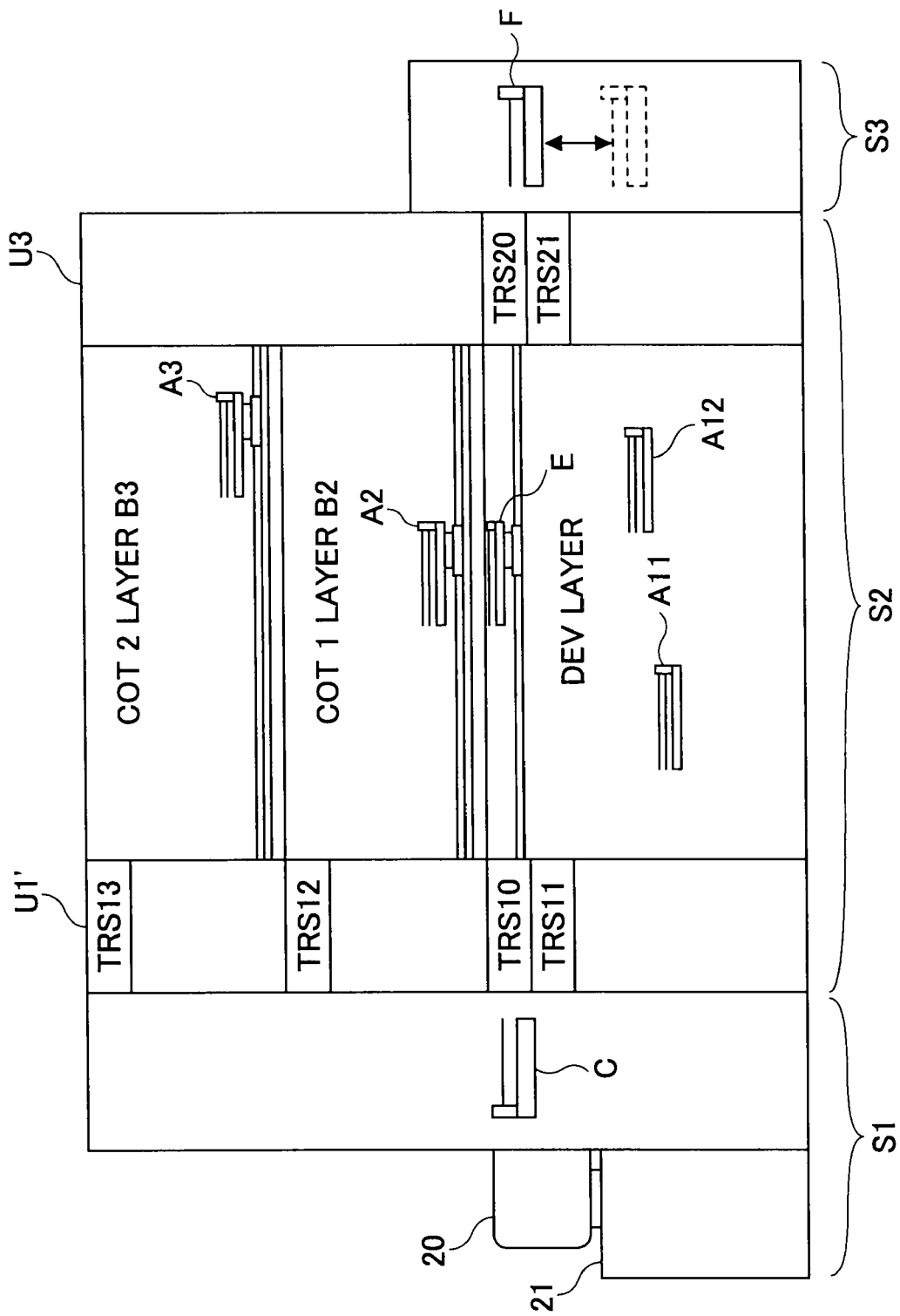
FIG. 4 is a schematic side cutaway view of the coater/developer according to the embodiment of the present invention.

FIG. 2, FIG. 3, and FIG. 4 are a cutaway plan view, a schematic perspective view, and a schematic side cutaway view, respectively, of a coater/developer applied to a resist pattern forming apparatus according to the embodiment of the present invention.

The coater/developer includes a carrier block S1 for carrying in and out a carrier 20 hermetically containing, for example, 13 semiconductor wafers W that are substrates, a processing block S2, an interface block S3, and an exposure unit S4. Hereinafter, the wafers W may also be referred to collectively as "the wafer W" for convenience of description.

In the carrier block S1, there are provided a placement table 21 on which multiple carriers 20 are placeable, opening and closing parts 22 provided in the front wall facing the placement table 21 side, and a transfer arm C forming a transfer part for extracting the wafer W from the carrier 20 through a corresponding one of the opening and closing parts 22. This transfer arm C is configured to be movable back and forth, movable up and down, rotatable about a vertical axis, and movable in the directions in which the carriers 20 are arranged, so as to transfer the wafer W to and receive the wafer W from a transfer module TRS11 of a below-described unit block B1.

On the bottom side of the carrier block S1, the processing block S2 enclosed by an enclosure 24 is connected to the carrier block S1. The processing block S2 is formed by vertically arranging multiple unit blocks. In this case, the processing block S2 is formed of three unit blocks allocated from the bottom side as a development layer (DEV layer) B1, which is a unit block for performing development, and two coating layers (COT1 layer and COT2 layer) B2 and B3, which are unit blocks for forming a resist film. These DEV layer B1, COT1 layer B2, and COT2 layer B3 are separated from one another. Here, the COT1 layer B2 and the COT2 layer B3 correspond to unit blocks for forming a coating film and the DEV layer B1 corresponds to a unit block for development.

These unit blocks B1, B2, and B3 are configured in the same manner, and each of the unit blocks B1, B2, and B3 includes a liquid processing module for coating the wafer W with coating liquid, various kinds of processing modules for performing pre-processing and post-processing of the processing performed in the liquid processing module, and a corresponding one or more of main arms A11, A12, A2, and A3, which are dedicated substrate conveyance parts for transferring the wafer W between the liquid processing module and the various processing modules.

Further, as shown in FIG. 2 and FIG. 4, a shelf unit U1 for transferring is provided at a position accessible by the transfer arm C and the corresponding one or more of the main arms A11, A12, A2, and A3 in a region adjacent to the carrier block S1 in each of the unit blocks B1, B2, and B3. In the shelf unit U1, a first transfer part for transferring/receiving the wafer W to/from other unit blocks is provided for each of the unit blocks B1 through B3, and the wafer W is transferred to/from each first transfer part provided in the shelf unit U1 with a transfer arm D configured to be movable back and forth and movable up and down.

Figure 5:
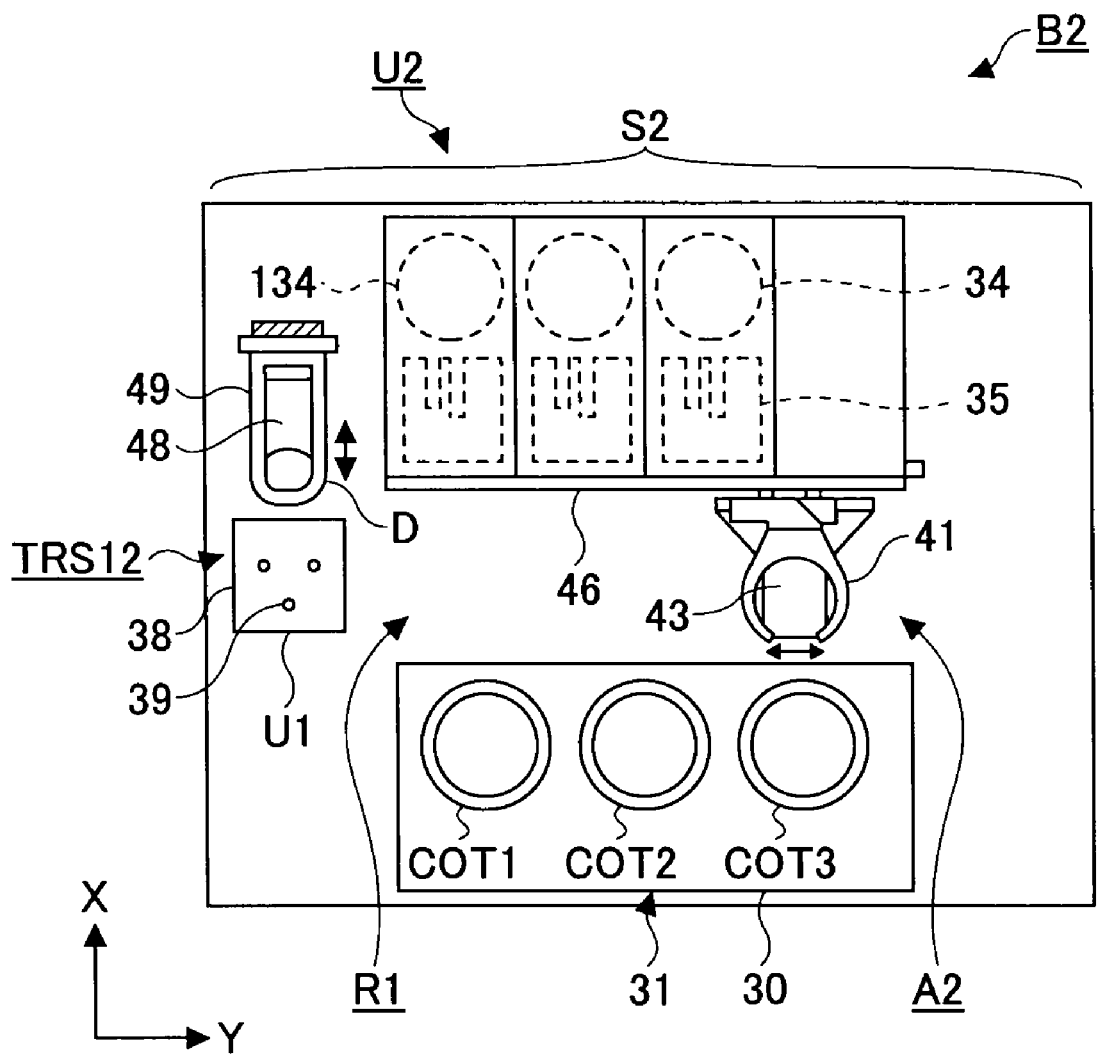
FIG. 5 is a plan view of the unit block of a COT1 layer in the coater/developer according to the embodiment of the present invention.
Figure 6:
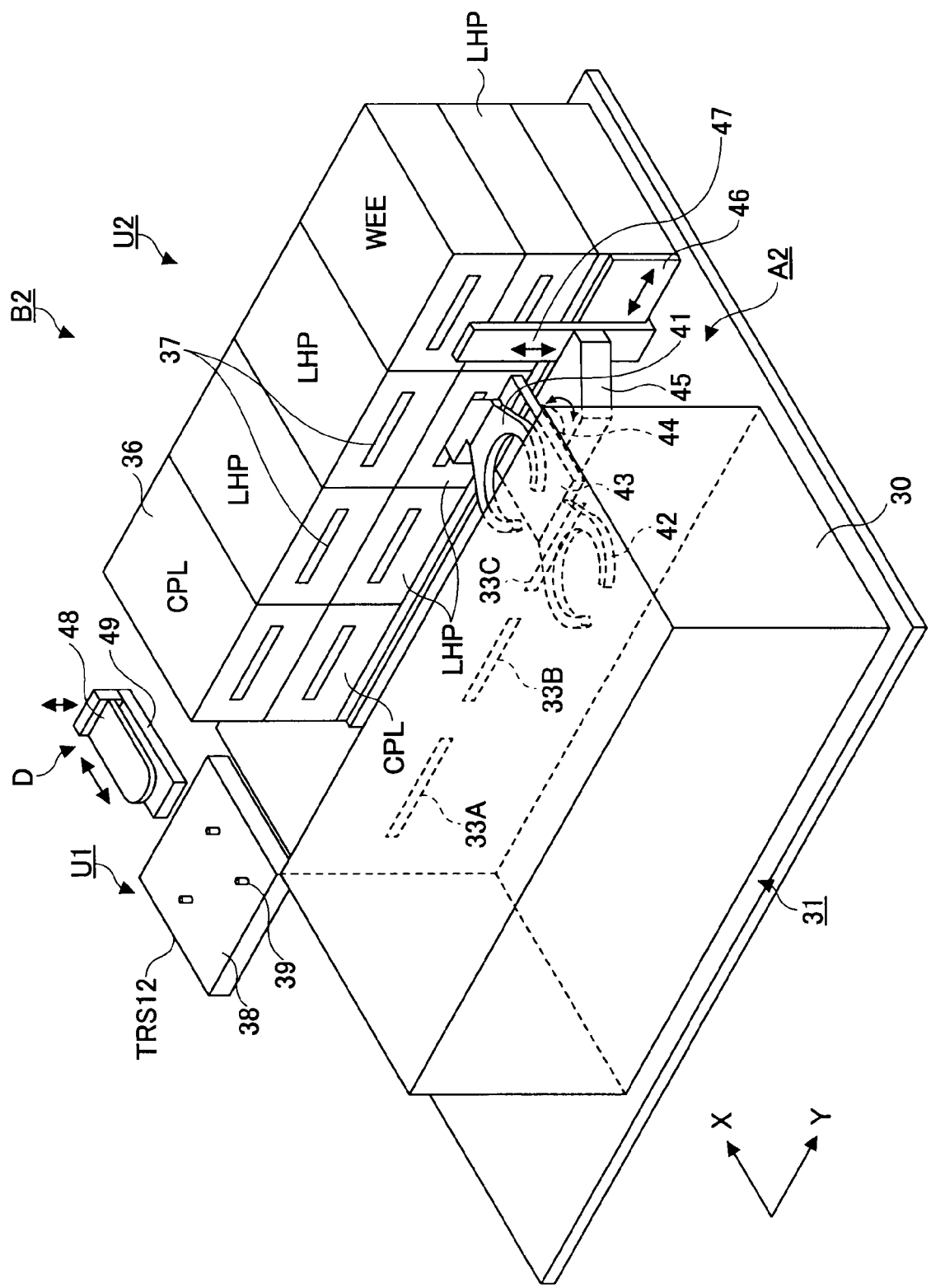
FIG. 6 is a perspective view of the unit block of the COT1 layer according to the embodiment of the present invention.

Next, a description is given, based on FIG. 5 and FIG. 6, of the configuration of each of the unit blocks B1 through B3, taking first the COT layer B2 as an example.

A wafer W conveyance region R1 is formed in the directions of the length of the COT1 layer B2 (the directions of the Y axis in FIG. 5 and FIG. 6) in the substantial center of the COT1 layer B2. Viewing from the carrier block S1 side, a coating part 31 including multiple coating modules for applying resist liquid is provided as a liquid processing module on the right side of the conveyance region R1.

The coating part 31 has multiple, for example, three coating modules COT1 through COT3 contained and arranged in the Y directions in a common processing container 30 so that each of the coating modules COT1 through COT3 faces the conveyance region R1. Each of the coating modules COT1 through COT3 is configured to coat the entire surface of the wafer W with resist liquid that is coating liquid by, for example, supplying the resist liquid from a common chemical liquid nozzle onto the wafer W attracted and adhered to a spin chuck so as to be held horizontally thereon, and rotating the wafer W. The processing container 30 has wafer W conveyance openings 33A through 33C (FIG. 6) at positions corresponding to the coating modules COT1 through COT3, respectively. The wafer W is conveyed between the coating modules COT1 through COT 3 and the main arm A2 through the corresponding openings 33A through 33C.

Further, a shelf unit U2 formed of processing modules arranged in, for example, vertically two rows (tiers) and horizontally four columns is provided across the conveyance region R1 from the coating part 31. In FIG. 6, the shelf unit U2 contains various processing modules for performing pre-processing and post-processing of the processing performed in the coating part 31. The processing modules include, for example, a heating and cooling module LHP that heats and thereafter cools the wafer W coated with resist liquid, a temperature adjusting module CPL that adjusts the wafer W to a predetermined temperature, and an edge exposure unit WEE.

For example, an apparatus that includes a heating plate 34 for receiving and heating the wafer W thereon and a cooling plate 35 also used as a transfer arm, and transfers the wafer W between the main arm A2 and the heating plate 34 with the cooling plate 35, that is, an apparatus capable of both heating and cooling in a single module, is used as the heating and cooling module LHP. The heating and cooling module LHP may be replaced with a heating module and a cooling module that are separately provided. Further, for example, an apparatus having a water-cooled cooling plate 134 is used as the temperature adjusting module CPL. Referring to FIG. 6, each of the modules such as the heating and cooling module LHP and the temperature adjusting module CPL is housed in a processing container 36, and a wafer carrying-in/out opening 37 is formed on the surface of each processing container 36 which surface faces the conveyance region R1.

Further, a transfer module TRS12 (FIG. 4) is provided as the first transfer part in the shelf unit U1 of the COT1 layer B2. The transfer module TRS12 is accessible by the main arm A2 of the COT1 layer B2 and the transfer arm D.

A description is given of the main arm A2. The main arm A2 is configured to be movable back and forth, movable up and down, rotatable about a vertical axis, and movable in the directions of the Y axis so as to transfer the wafer W among all the modules (where the wafer W is placed) in the COT1 layer B2, such as the coating modules COT1 through COT3, the transfer module TRS12 of the shelf unit U1, and the processing modules of the shelf unit U2.

As shown in FIG. 5 and FIG. 6, the main arm A2 includes two holding arms 41 and 42 for supporting the bottom-side edge region (periphery) of the wafer W. The holding arms 41 and 42 are configured to be movable back and forth over a base 43 independent of each other. The base 43 is provided on a conveyance base body 45 through a rotational mechanism 44 so as to be rotatable about a vertical axis. The conveyance base body 45 is configured to be movable up and down along a guide rail 47 for vertical movements. Further, the lower end of the guide rail 47 for vertical movements is fixed under a guide rail 46 extending the directions of the length of the conveyance region R1 (the directions of the Y axis in FIG. 5 and FIG. 6). The guide rail 47 for vertical movements laterally moves along the guide rail 46 so that the conveyance base body 45 can laterally move in the conveyance region R1. The guide rail 47 for vertical movements is provided on the conveyance base body 45 at a position offset from where the holding arms 41 and 42 move back and forth so as not to interfere with the holding arm 41 or 42 when the wafer W is transferred to/from the processing modules of the shelf unit U2.

Further, the transfer arm D includes a single support arm 48 for supporting the bottom side of the wafer W and a base body 49 configured to be movable up and down. The support arm 48 is attached to the base body 49 so as to be movable back and forth. Further, the transfer module TRS12 includes a transfer stage 38 and multiple, for example, three projections 39 that hold the bottom side of the wafer W. The projections 39 are formed on the transfer stage 38 at positions that do not interfere with the main arm A2 or the transfer arm D when the main arm A2 or the transfer arm D enters the transfer stage 38.

The COT2 layer B3 has the same configuration as the COT1 layer B2. In the following description, the elements of the COT2 layer B3 corresponding to those of the COT1 layer B2 described above are referred to by the same reference numerals. In the COT2 layer B3, the coating part 31 containing multiple, for example, three coating modules for supplying resist liquid to the wafer W and forming a resist film thereon is provided as a liquid processing module, and the heating and cooling module LHP, the temperature adjusting module CPL, and the edge exposure unit WEE are provided in the shelf unit U2. Further, a transfer module TRS13 is provided as the first transfer part at a position accessible by the transfer arm D in the shelf unit U1. The wafer W is transferred among the coating modules and the modules provided in the shelf units U1 and U2 with the main arm A3.

Figure 7:
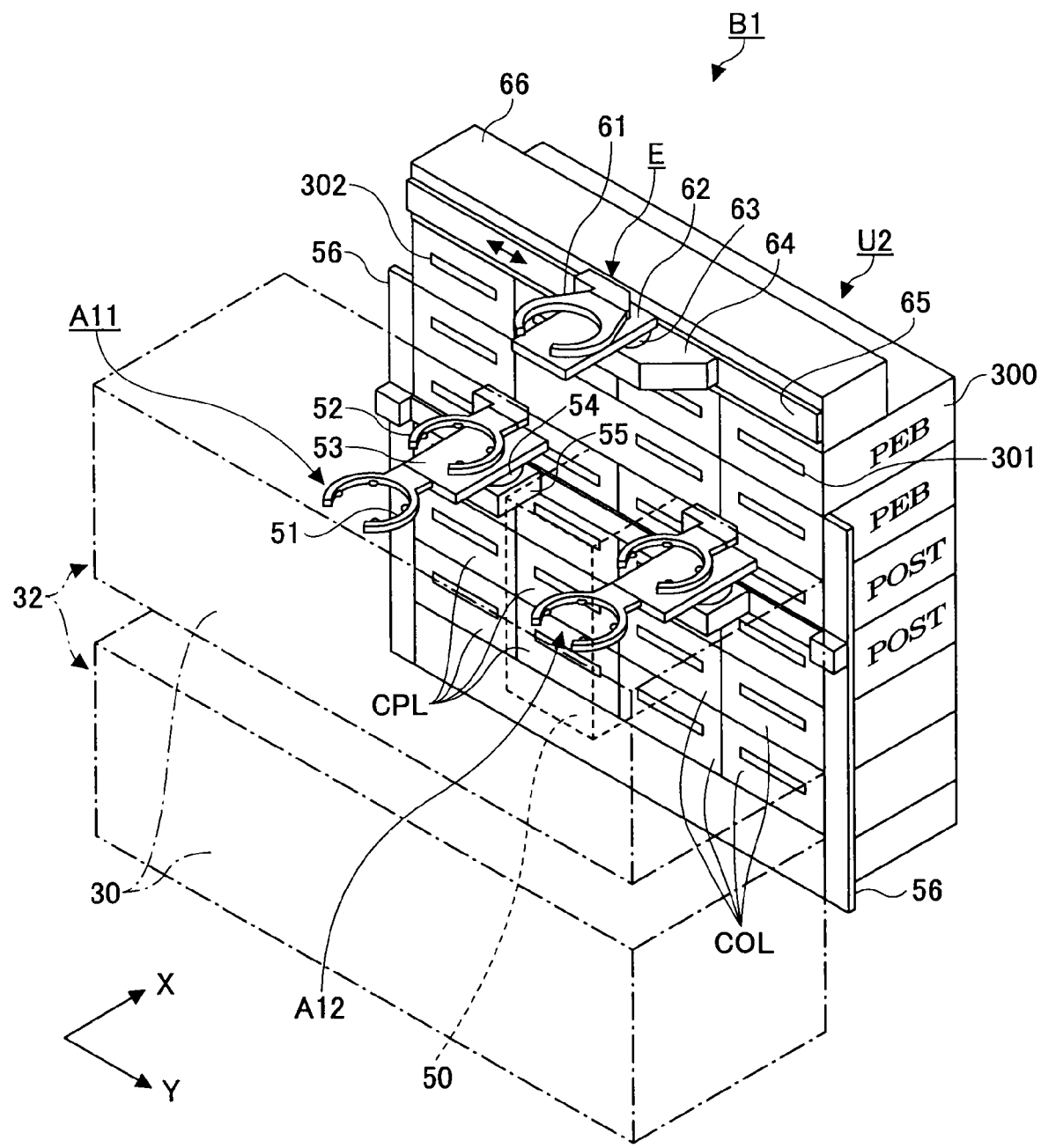
FIG. 7 is a perspective view of the unit block of a DEV layer in the coater/developer according to the embodiment of the present invention.

Next, a description is given of the DEV layer B1. In the following description, the elements of the DEV layer B1 corresponding to those of the COT1 layer B2 described above are referred to by the same reference numerals. As shown in FIG. 2 and FIG. 7, the DEV layer B1 includes the shelf unit U1, the shelf unit U2, and a liquid processing module the same as in the COT1 layer B2. In the DEV layer B1, the liquid processing module is formed of, for example, two development parts 32 provided in upper and lower tiers. Each development part 32 contains four development modules DEV1 through DEV4. The shelf unit U1, the shelf unit U2, and the liquid processing module are arranged in the same manner as in the COT1 layer B2. That is, in the DEV layer B1 also, the development parts 32 (liquid processing module) and the shelf unit U2 are provided so as to face each other across the conveyance region R1 extending in the directions of the Y axis. The two main arms A11 and A12 are provided in the conveyance region R1 of the DEV layer B1. A shelf unit U3 forming a second transfer part for transferring the wafer W between the processing block S2 and the interface block S3 is provided in a region adjacent to the interface block S3 in the conveyance region R1.

Each of the development parts 32 has substantially the same configuration as the above-described coating part 31 except for having the four development modules DEV1 through DEV4, which are housed in the common processing container 30. Each of the development modules DEV1 through DEV4 is configured to, for example, coat the surface of the wafer W attracted and adhered to a spin chuck so as to be held horizontally thereon with developer by supplying the developer from a common chemical liquid nozzle onto the wafer W and rotating the wafer W, to wash away the developer after passage of a predetermined period of time by supplying pure water that is cleaning liquid from a common cleaning nozzle, and thereafter to dry the surface of the wafer W by rotating the wafer W at high speed.

The transfer module TRS11 (FIG. 4) for transferring/receiving the wafer W to/from the carrier block S1 is provided as the first transfer part at a position accessible by the transfer arm D in the shelf unit U1. The transfer module TRS11 is accessed by the main arm A11 and the transfer arm D. Further, a transfer module TRS10 (FIG. 4) accessed by a below-described shuttle arm E (FIG. 7) and the transfer arm D is also provided in the shelf unit U1.

Further, the shelf unit U2 is configured, for example, as shown in FIG. 7. This shelf unit U2 contains various processing modules such as a heating module PEB called a post-exposure baking module or the like that heats the wafer W after exposure, a cooling module COL for adjusting the wafer W to a predetermined temperature after the processing in the heating module PEB, a heating module POST called a post-baking module or the like that heats the wafer W after development so as to dry the wafer W, and a temperature adjusting module CPL for adjusting the wafer W to a predetermined temperature after the processing in the heating module POST. Of these, the cooling module COL and the temperature adjusting module CPL correspond to cooling modules for cooling the wafer W after heat treatment, and the cooling module COL and the temperature adjusting module CPL correspond to a pre-processing module that performs pre-processing on the wafer W before development and a post-processing module that performs post-processing on the wafer W after development, respectively.

In this case, heating modules PEB and heating modules POST are arranged in, for example, respective two tiers so as to extend along the directions of the length of the conveyance region R1. Under the heating modules PEB and POST, for example, four cooling modules COL and four temperature adjusting modules CPL are arranged side by side in the directions of the length of the conveyance region R1.

Further, the shelf unit U3 includes transfer modules TRS20 and TRS21 (FIG. 4) for transferring/receiving the wafer W to/from the interface block S3 as a second transfer part. Of these, the transfer module TRS20 is accessed by the shuttle arm E and an interface arm F (FIGS. 2 and 4) described below, and the transfer module TRS21 is accessed by the main arm A12 and the interface arm F. In the above, all the transfer modules provided in the shelf units U1 and U3 and the transfer stages of a below-described transfer unit 50 (FIGS. 2 and 7) are configured in the same manner as the above-described transfer module TRS12.

The main arms A11 and A12 are configured in the same manner as the above-described main arm A2 of the COT1 layer B2, that is, the main arms A11 and A12 are configured to be movable back and forth, movable up and down, and rotatable about a vertical axis, except that the main arms A11 and A12 do not move in the directions of the Y-axis and that the shape of their holding arms is different. Specifically, as shown in FIG. 7, each of the main arms A11 and A12 includes two holding arms 51 and 52 for supporting the bottom-side edge region (periphery) of the wafer W. The holding arms 51 and 52 are configured to be movable back and forth over a base 53 independent of each other. The base 53 is provided on a conveyance base body 55 through a rotational mechanism 54 so as to be rotatable about a vertical axis. The conveyance base body 55 is configured to be movable up and down along guide rails 56 for vertical movements. Here, the guide rails 56 for vertical movements are provided in such a manner as to not interfere with the holding arm 51 or 52 when the wafer W is transferred to/from the processing modules of the shelf unit U2. A description is given below of the shape of the holding arms 51 and 52.

Further, the transfer unit 50 having transfer stages provided in multiple stages (tiers) is provided at a position accessible by the holding arms A11 and A12 between the holding arms A11 and A12 in the conveyance region R1. The transfer unit 50 has transfer stages for placing the wafers W before development in about five stages (tiers) in its upper part and has transfer stages for placing the wafers W after development in about five stages (tiers) in its lower part, for example.

The main arm A11 is configured to transfer the wafer W among below-described carrying-out transfer parts 82 (FIG. 8) of the heating modules PEB and POST, the transfer module TRS11 of the shelf unit U1, four processing modules provided under the heating modules PEB and POST in the left half of the shelf unit U2 in a view from the conveyance region R1, the transfer unit 50, and the two development modules DEV1 and DEV2 placed on the carrier block S1 side in the development part 32. The main arm A12 is configured to transfer the wafer W among below-described carrying-in transfer parts 81 (FIG. 8) of the heating modules PEB and POST, the transfer module TRS21 of the shelf unit U3, four processing modules provided under the heating modules PEB and POST in the right half of the shelf unit U2 in a view from the conveyance region R1, the transfer unit 50, and the two development modules DEV3 and DEV4 placed on the interface block S3 side in the development part 32. Here, in the shelf unit U2, the cooling modules COL are arranged as processing modules in the region accessed by the main arm A12 and the temperature adjusting modules CPL are arranged as processing modules in the region accessed by the main arm A11.

Further, the shuttle arm E is provided in the DEV layer B1. A description is given, with reference to FIG. 7, of this shuttle arm E. The shuttle arm E includes a single holding arm 61 that supports the bottom-side edge region (periphery) of the wafer W and moves back and forth along a base 62. The base 62 is provided on a conveyance base body 64 through a rotational mechanism 63 so as to be rotatable about a vertical axis. For example, the conveyance base body 64 is configured to move in the directions of the length of the conveyance region R1 along a guide rail 65, which is provided on the surface of a support member 66 which surface faces the conveyance region R1 so as to extend along the directions of the length of the shelf unit U2 (the directions of the Y-axis in FIG. 7). The support member 66 is provided on the upper side of the shelf unit U2. Thus, the shuttle arm E is configured to convey the wafer W between the transfer module TRS10 (FIG. 4) of the shelf unit U1 and the transfer module TRS20 (FIG. 4) of the shelf unit U3.

On the other hand, referring to FIGS. 2 through 4, the exposure unit S4 is connected through the interface block S3 to the bottom side (opposite to the carrier block S1 side) of the shelf unit U3. The interface arm F for transferring the wafer W to/from the second transfer part of the shelf unit U3 of the processing block S2 and the exposure unit S4 is provided in the interface block S3 so as to be movable back and forth, movable up and down, and rotatable about a vertical axis.

The resist pattern forming apparatus includes a control part 7 (FIG. 2) formed of a computer. The control part 7 manages the recipe of each processing module, manages the recipe of a conveyance flow (conveyance path) of the wafer W, performs processing in each processing module, and controls driving of the main arms A11, A12, A2, and A3, the transfer arm C, the transfer arm D, the shuttle arm E, and the interface arm F. The control part 7 includes a program storage part formed of, for example, computer programs. The program storage part contains programs formed of, for example, software having groups of steps (commands) so that the operation of the entire resist pattern forming apparatus, that is, the processing in each processing module and conveyance of the wafer W for forming a predetermined resist pattern on the wafer, is performed. These programs are read into the control part 7 so that the operation of the entire resist pattern forming apparatus is controlled by the control part 7. These programs are stored in the program storage part, while being contained in a storage medium such as a flexible disk, a hard disk, a compact disk, a magneto-optical disk, or a memory card.

According to this embodiment, the heating module PEB and the heating module POST have the same configuration, and a description is given next, based on FIG. 2 and FIG. 7 through FIG. 11, of the heating modules PEB and POST, taking the heating module PEB as an example.

Referring to FIG. 7, the heating module PEB is provided in a processing container 300 facing the conveyance region R1. A carrying-in opening 301 for carrying the wafer W into the heating module PEB and a carrying-out opening 302 for carrying the wafer W out of the heating module PEB are provided on the surface of the processing container 300 which surface faces the conveyance region R1.

The heating module PEB has a heating region 80 for performing heat treatment on the wafer W, the carrying-in transfer part 81, and the carrying-out transfer part 82 provided inside the processing container 300. The heating region 80 extends along the directions of the length of the DEV layer B1 (the directions of the Y-axis in FIG. 2 and FIG. 7 through FIG. 9). The carrying-in transfer part 81 is provided on one side of the heating region 80 in its lengthwise directions. The carrying-out transfer part 82 is provided on the other side of the heating region 80 in its lengthwise directions. Referring to FIG. 2, the carrying-in transfer part 81 is provided in a region accessed by the main arm A12 on the interface block S3 side, and the carrying-out transfer part 82 is provided in a region accessed by the main arm A11 on the carrier block S1 side. Here, the main arm A12 corresponds to a carrying-in substrate conveying part, and the main arm A11 corresponds to a carrying-out substrate conveying part.

The heating region 80 is sized in its lengthwise directions so as to allow multiple, for example, three wafers W to be arranged in the directions of the length of the DEV layer B1, for example. The heating region 80 is sized in its widthwise directions (the directions of the X-axis in FIG. 8 and FIG. 9) so as to be suitable for heating a single wafer W, for example.

The wafer W is conveyed in the heating region 80 in its lengthwise directions from the interface block S3 side to the carrier block S1 side while being on a conveyance path member 9. The conveyance path member 9 is engaged with and extended between a pair of rotary bodies 91 and 92 so as to move along an orbit. The rotary bodies 91 and 92 rotate about their respective horizontal axles, and are spaced apart from each other in the lengthwise directions of the heating module PEB with their rotational axles being parallel to each other. In this manner, the conveyance path member 9 forms part of the conveyance path of the wafer W from the interface block S3 to the carrier block S1. Specifically, the conveyance path member 9 includes multiple rod-shaped conveyance members that extend parallel to the rotational axles of the rotary bodies 91 and 92 and on which the wafer W is placed, and a pair of timing belts 93 that are connected to both ends of the conveyance members and move along the orbit. The timing belts 93 are wound around and extended between the rotary bodies 91 and 92.

Figure 9:
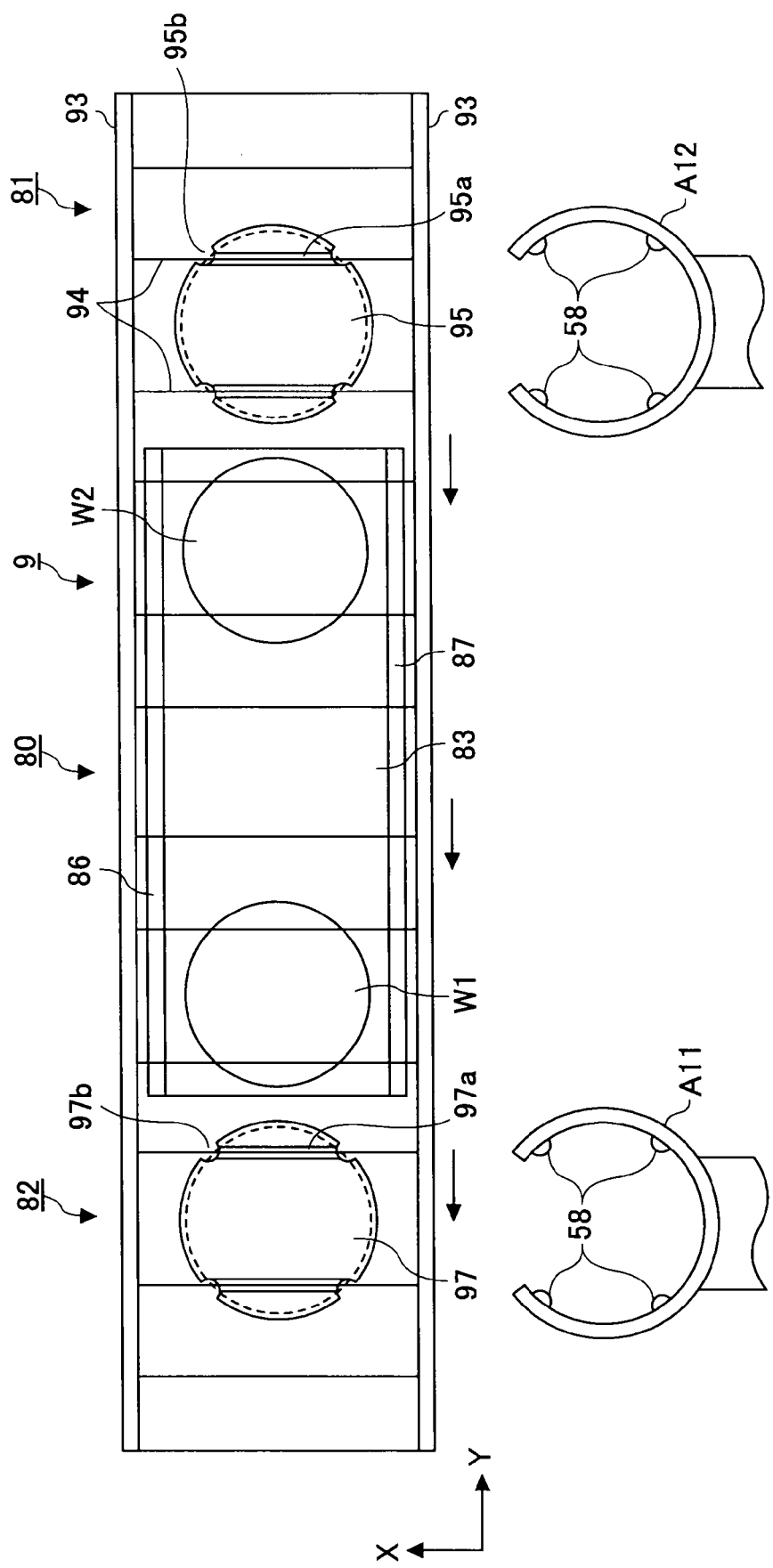
FIG. 9 is a plan view of the heating module according to the embodiment of the present invention.

The conveyance members are formed of multiple wires 94 that extend parallel to the rotational axles of the rotary bodies 91 and 92 and convey the wafer W placed thereon. For example, the length of the wires 94 is determined so as to cover the width of the heating region 80 as shown in FIG. 9. These wires 94 are formed of a high-temperature material that is not denatured by heat even when the wafer W is subjected heat treatment at 23° C. to 250° C. Examples of such a material include synthetic fibers such as aramid fibers (for example, Kevlar of DuPont) and ceramic fibers such as silicon carbide fibers (for example, Nicalon of Nippon Carbon Co., Ltd.) and carbon fibers (for example, a Toray Industries Inc. product). The wires 94 are, for example, approximately 0.5 mm in diameter.

Figure 11:
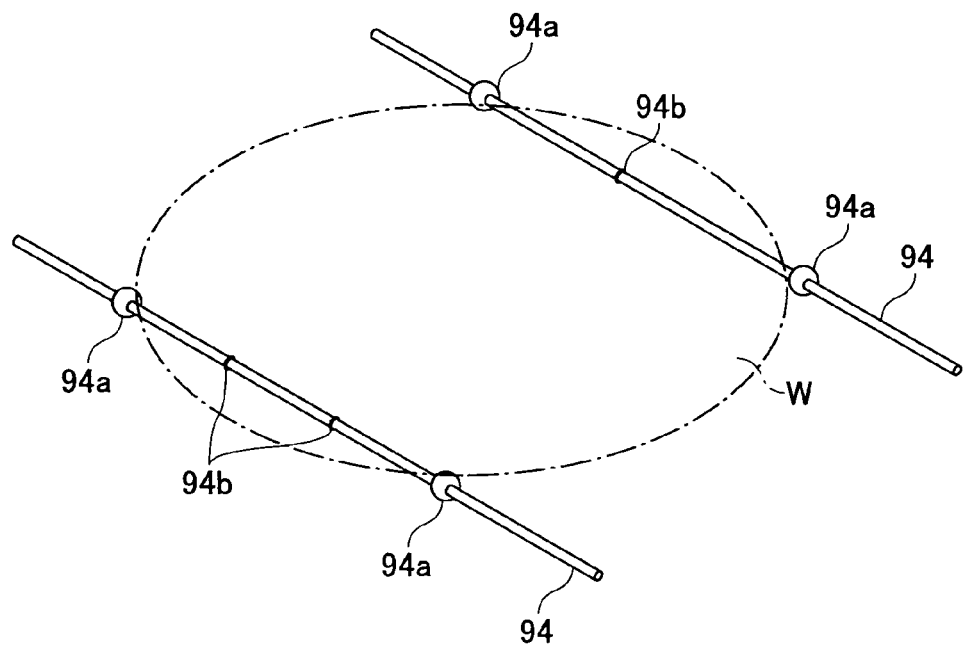
FIG. 11 is a perspective view of wires provided in the heating module according to the embodiment of the present invention.

The wafer W is conveyed while being held by paired two of the wires 94 provided parallel to each other. Further, the wires 94 are provided with, for example, substrate guides 94a formed of ceramic or quartz as shown in FIG. 11. When the wafer W is transferred from the main arm A12 to the wires 94, the substrate guides 94a are positioned around the periphery of the wafer W so as to prevent displacement of the wafer W. Further, the wires 94 are provided with, for example, proximity members 94b formed of ceramic or quartz so as to hold the wafer W slightly over the wires 94 with a gap of, for example, approximately 0.5 mm to 1.0 mm therebetween.

The paired rotary bodies 91 and 92 are provided so that their rotational axles extend parallel to each other in the directions of the width of the heating region 80. The length of the rotary bodies 91 and 92 is determined so as to cover the width of the heating region 80. The rotary bodies 91 and 92 are provided so as to face each other across the heating region 80 so that the rotary body 91 is positioned on the upstream side of the carrying-in transfer part 81 in the wafer conveying (moving) direction (from right to left in FIG. 9) and the other rotary body 92 is positioned on the downstream side of the carrying-out transfer part 81 in the wafer conveying direction. Thus, the carrying-in transfer part 81 is provided at the upstream end of the conveyance path formed by the conveyance path member 9, and the carrying-out transfer part 82 is provided at the downstream end of the conveyance path.

Figure 8:
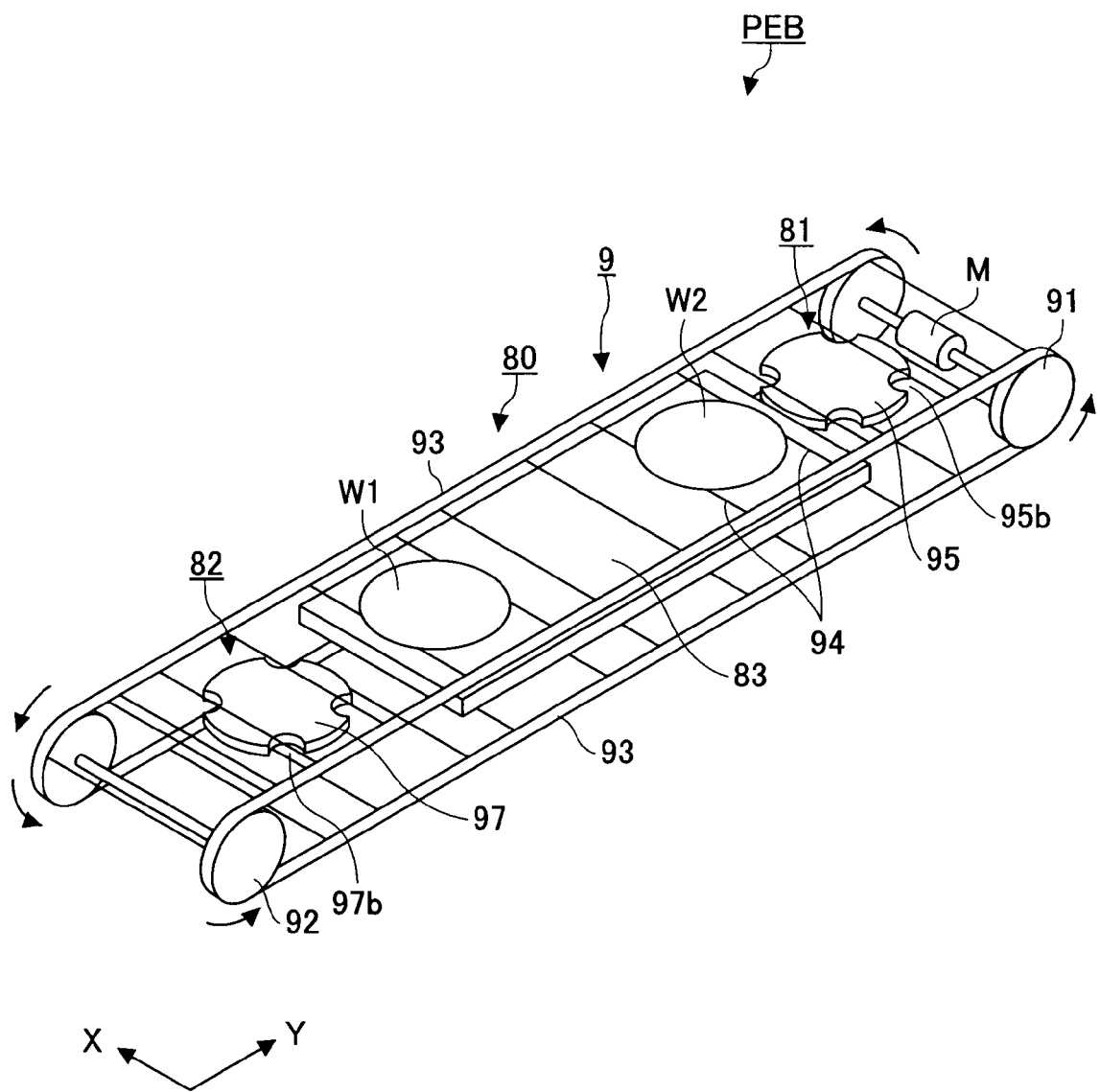
FIG. 8 is a perspective view of a heating module provided in the coater/developer according to the embodiment of the present invention.

Referring to FIG. 8, the rotary body 91 is formed of, for example, drive pulleys rotated by a motor M, and the rotary body 92 is formed of driven pulleys. The timing belts 93 are wound around the corresponding lengthwise ends of the rotary bodies 91 and 92, and the pairs of wires 94 are provided on the timing belts 93 at predetermined intervals. The driving of the motor M is controlled by the control part 7 (FIG. 2).

Thus, by rotating the rotary bodies 91 and 92, the wires 94 move along the orbit so as to move from the carrying-in transfer part 81 to the carrying-out transfer part 82 through the heating region 80 and then return to the carrying-in transfer part 81 again. FIG. 8 is a perspective view for illustrating the conveyance path member 9, in which a below-described upper heat plate 84 (FIG. 10) and members provided inside the orbit of the timing belts 93 are omitted for convenience of graphical representation.

Figure 10:
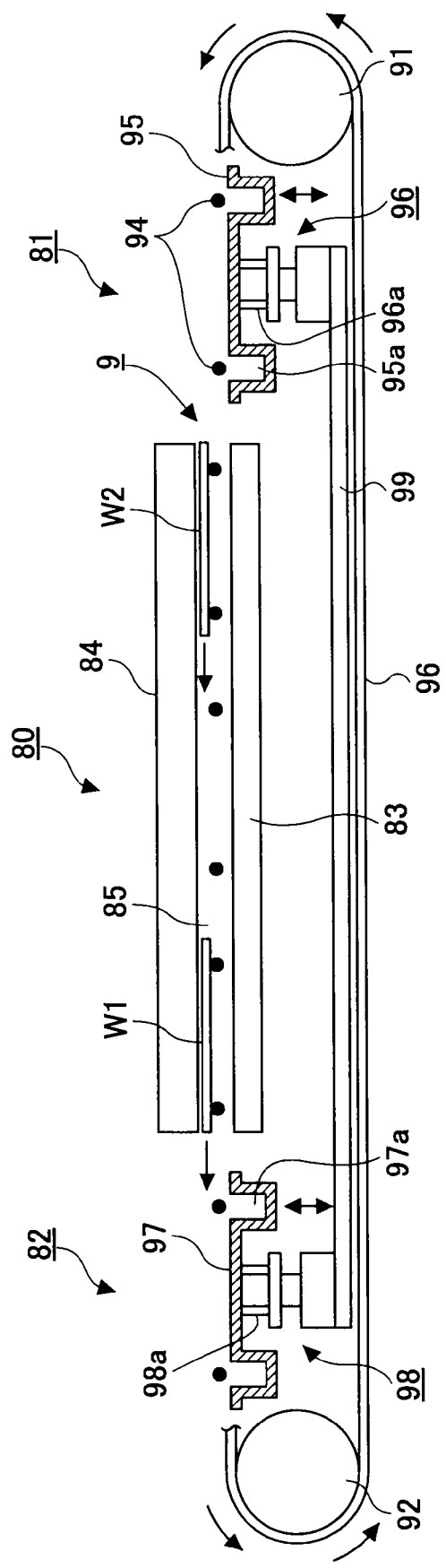
FIG. 10 is a cross-sectional view of the heating module according to the embodiment of the present invention.

Referring to FIG. 10, in the heating region 80, a heat plate 83 and the heat plate 84, each formed of aluminum nitride (AlN) or silicon carbide (SiC), are provided, for example, below and above the wires 94, respectively. Of these, the lower heat plate 83 corresponds to a first heat plate and is provided inside the orbit of the wires 94, and the upper heat plate 84 corresponds to a second heat plate. These heat plates 83 and 84 are sized in their lengthwise directions so as to cover multiple, for example, three wafers W arranged in the lengthwise directions of the DEV layer B1, and are sized in their widthwise directions (the directions of the X-axis in FIG. 8 and FIG. 9) so as to be suitable for performing heat treatment on, for example, a single wafer W. Thereby, a heating space 85 where the wafer W is heated is formed between the upper and lower heat plates 84 and 83. The vertical dimension L1 of this heating space 85 (FIG. 12) is, for example, approximately 5 mm.

Figure 12:
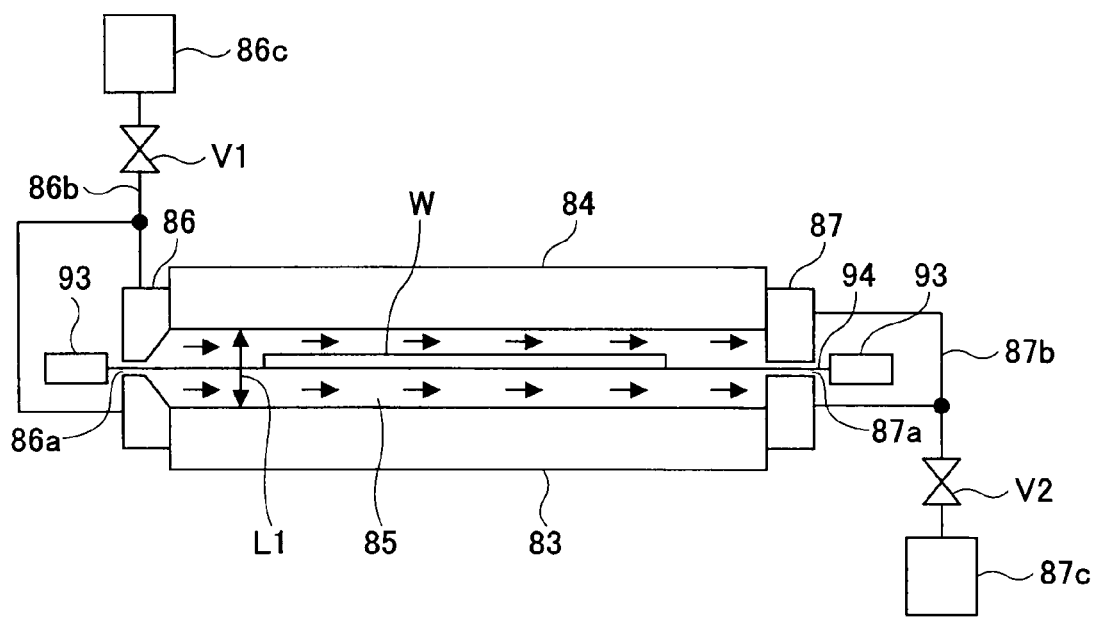
FIG. 12 is a front view of the heating module, showing heat plates and the wires, according to the embodiment of the present invention.

As shown in, for example, FIG. 12, a gas ejection part 86 for feeding gas into the heating space 85 is provided in contact with the heat plates 83 and 84 over their entire length at one end side of the heat plates 83 and 84 in their widthwise directions so as to close the gap between the heat plates 83 and 84.

Referring to FIG. 12, the gas ejection part 86 includes a gap 86a that forms a region through which the wires 94 pass, and is configured to eject gas toward the heating space 85 from, for example, the upper side and the lower side of the gap 86a. For example, in the gas ejection part 86, multiple small holes (not graphically illustrated) are provided as ejection openings at regular intervals along the lengthwise directions of the heating region 80, and gas is ejected into the heating space 85 through these ejection openings.

The gas ejection part 86 is connected through a gas feed pipe 86b and a valve V1 to a gas source 86c where a clean purge gas, for example, an inert gas such as nitrogen gas, is stored. A heating part that heats the purge gas may be provided in this gas ejection part 86. For example, the heating part may have a heat transfer plate provided inside the gas ejection part 86 and a heat pipe having one end connected to the heat plate 83 (or 84) and the other end connected to the heat transfer plate, and heat the purge gas by supplying the heat of the heat plate 83 (or 84) to the heat transfer plate through the heat pipe. Alternatively, the heating part may have a heater provided near the exit of the gas feed pipe 86b and heat the purge gas with the heater.

On the other hand, an exhaust part 87 is connected to the other end side of the heat plates 83 and 84 as shown in FIG. 12. The gas ejection part 86 and the exhaust part 87 are provided on the right side and on the left side, respectively, of the wafer W in the moving direction of the wafer W (wafer conveyance direction) when the wafer W is in the heating region 80, so as to be able to cover the diameter (width) of the wafer W and form what should be called unidirectional gas flow or gas flow flowing from the right side to the left side in the heating space 85, that is, from one end side to the other end side of the wafer W.

This exhaust part 87 is provided in contact with the heat plates 83 and 84 over their entire length so as to close the gap between the heat plates 83 and 84. Further, referring to FIG. 12, the exhaust part 87 includes a gap 87a that forms a region through which the wires 94 pass. Further, suction exhaust openings (not graphically illustrated) for discharging the atmosphere inside the heating space 85 from, for example, the upper side and the lower side of the gap 87a are formed along the lengthwise directions of the heating region 80. These suction exhaust openings may be formed like, for example, slits so as to face the gas ejection part 86 or may be small holes provided at regular intervals along the lengthwise directions of the heating region 80. The exhaust part 87 is connected to an exhauster 87c such as an ejector through an exhaust pipe 87b and a valve V2.

The gap 86a of the gas ejection part 86 and the gap 87a of the exhaust part 87 are formed to have a vertical dimension of, for example, approximately 3 mm, so that the wires 94 enter the gaps 86a and 87a. The timing belts 93 are positioned outside the gas ejection part 86 and the exhaust part 87. Further, the gas feed pipe 86b and the exhaust pipe 87b are provided in such a manner as to not hinder the orbital motion of the wires 94. The valves V1 and V2 are controlled by the control part 7 (FIG. 2).

Referring to FIG. 8 through FIG. 10, the carrying-in transfer part 81 includes a first cooling plate 95 provided, for example, in the region inside the orbit of the wires 94. The first cooling plate 95 is formed of, for example, aluminum in a substantially circular plate shape having substantially the same diameter as the wafer W, and is configured to roughly cool the wafer W with a cooling mechanism (not graphically illustrated) provided on the bottom side of the cooling plate 95.

Groove parts 95a for the wires 94 to get into are formed in the first cooling plate 95 at positions corresponding to the two wires 94 in a first transfer position. Here, the first transfer position is where the wafer W is transferred from the main arm A12 onto the wires 94 positioned above the first cooling plate 95 as shown in FIG. 9 and FIG. 10. The groove parts 95a are not shown in FIG. 8, and the groove parts 95a are shown enlarged in FIG. 10 for convenience of graphical representation.

Further, an elevation pin mechanism 96 for moving up and down the first cooling plate is provided in the region inside the orbit of the wires 94. The elevation pin mechanism 96 includes multiple elevation pins 96a configured to be movable up and down. Thus, the first cooling plate 95 is configured to be movable up and down relative to the wires 94. The first cooling plate 95 may also be configured to be movable up and down relative to the wires 94 by moving up and down the wires 94 instead of moving up and down the first cooling plate 95.

Further, as shown in FIG. 8 and FIG. 9, cutout parts 95b are formed at, for example, four points on the periphery of the first cooling plate 95 toward its center. As described below, the cutout parts 95b are used in transferring the wafer W from the main arm A12 to the first cooling plate 95.

Further, the carrying-out transfer part 82 is configured in the same manner as the carrying-in transfer part 81, and has a second cooling plate 97 provided, for example, in the region inside the orbit of the wires 94 as shown in FIG. 8 through FIG. 10. The second cooling plate 97 has the same configuration as the first cooling plate 95, and groove parts 97a for the wires 94 to get into are formed in the second cooling plate 97 at positions corresponding to the two wires 94 in a second transfer position. Here, the second transfer position is where the wafer W is transferred from the wires 94 positioned above the second cooling plate 97 to the main arm A11 as shown in FIG. 9 and FIG. 10. Cutout parts 97b are formed in the second cooling plate 97, and an elevation pin mechanism 98 that moves up and down multiple elevation pins 98a is provided. The elevation pin mechanisms 96 and 98 are provided on a base plate 99 (FIG. 10).

Here, a description is given of the shape of the holding arms 51 and 52 of the main arms A11 and A12 according to this embodiment.

Figure 13A:
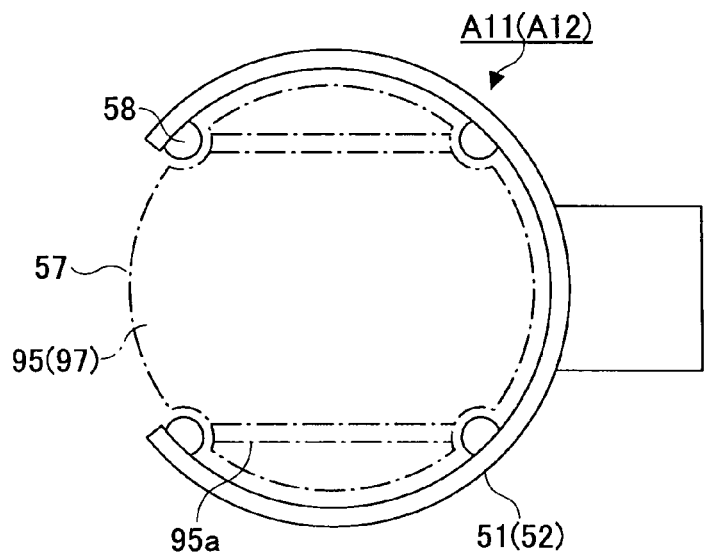
FIGS. 13A and 13B are a plan view and a perspective view, respectively, of a main arm used in the unit block of the DEV layer according to the embodiment of the present invention.
Figure 13B:
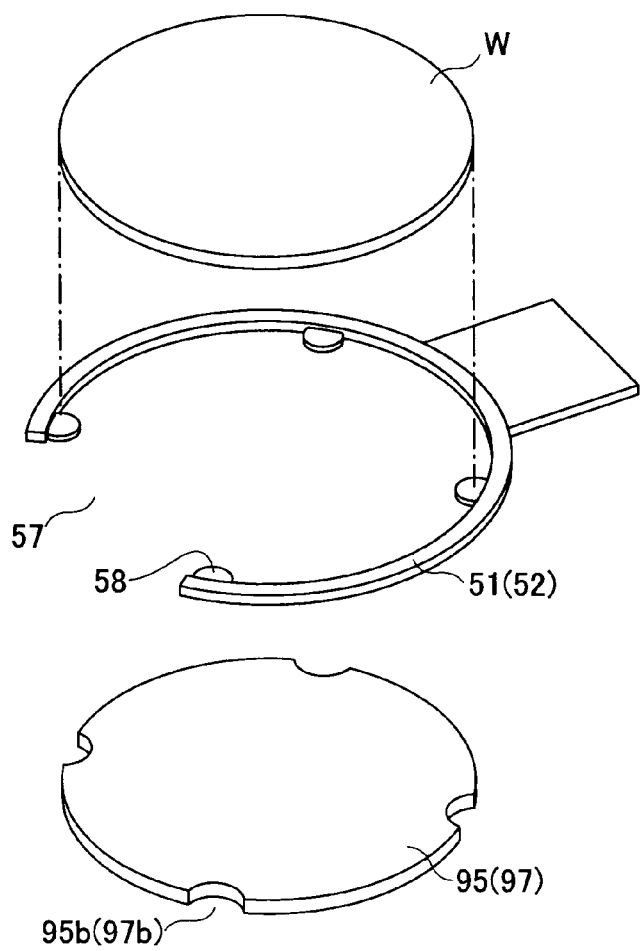

Each of the holding arms 51 and 52 of the main arms A11 and A12 has a horizontal horseshoe shape as shown in, for example, FIG. 9 and FIGS. 13A and 13B, and has a cutout part 57 formed on the front side. The inside diameter of the holding arms 51 and 52 is slightly larger than the diameter of the first and second cooling plates 95 and 97. Four projecting pieces 58 are provided on the lower part of the interior circumferential surface of each of the holding arms 51 and 52 so as to extend inward. The wafer W is held on these projecting pieces 58. The groove parts 95a or 97a are omitted in the cooling plate 95 or 97 in FIG. 13B.

As described above, the holding arms 51 and 52 are configured to be movable up and down, movable back and forth, and rotatable about a vertical axis. In the case of transferring the wafer W onto the first cooling plate 95, first, the wires 94 are positioned in the above-described first transfer position, and the first cooling plate 95 is positioned above the wires 94 so that the holding arm 51 or 52 can recede from between the cooling plate 95 and the wires 94. Then, the holding arm 51 or 52 holding the wafer W is caused to enter the processing container 300 through the carrying-in opening 301 so as to be above the first cooling plate 95 of the carrying-in transfer part 81. The peripheral cutout parts 95b of the first cooling plate 95 are provided at positions corresponding to the projecting pieces 58 of the holding arm 51 or 52. Accordingly, the wafer W on the holding arm 51 or 52 is transferred onto the first cooling plate 95 by the holding arm 51 or 52 descending so as to cover the first cooling plate 95 from above. After transferring the wafer W, the holding arm 51 or 52 moves down above the wires 94, and recedes so that its front-side cutout part 57 passes outside the groove parts 95a, thereby receding from the processing container 300.

On the other hand, in the carrying-out transfer part 82, after conveying the wafer W to the second transfer position with the wires 94, the second cooling plate 97 is moved up above the wires 94 to receive the wafer 97. Next, the main arm A11 is caused to enter between the second cooling plate 97 and the wires 94 and thereafter to move up, thereby transferring the wafer W on the second cooling plate 97 to the holding arm 51 or 52. The holding arm 51 or 52 recedes directly after receiving the wafer W so as to exit from the processing container 300 through the carrying-out opening 302.

Next, a description is given, with reference to FIGS. 14A through 14E, of heat treatment performed in the heating module PEB.

First, the wires 94 are stopped at the first transfer position, and a wafer W1 having its surface coated with a resist film that is a coating film and subjected to exposure is conveyed into the processing container 300 through the carrying-in opening 301 with the main arm A12. The wafer W1 is transferred onto the wires 94 through the first cooling plate 95 as described above in the carrying-in transfer part 81.

Figure 14A:
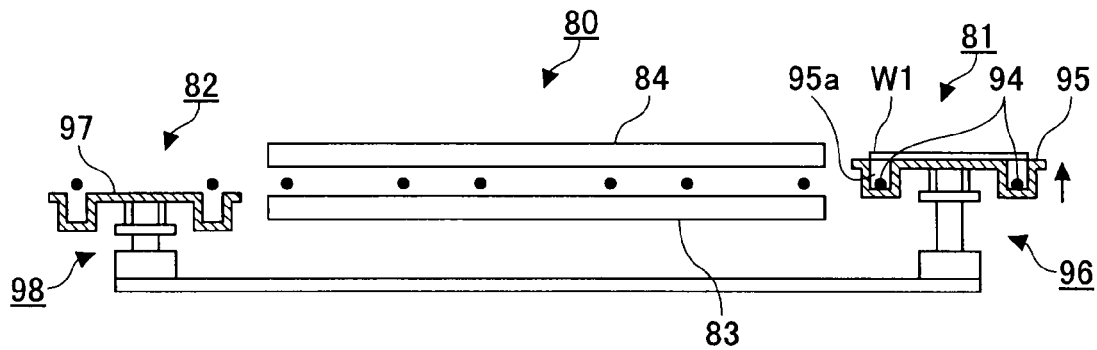
FIGS. 14A through 14E are process diagrams for illustrating an action of the heating module according to the embodiment of the present invention.
Figure 14B:
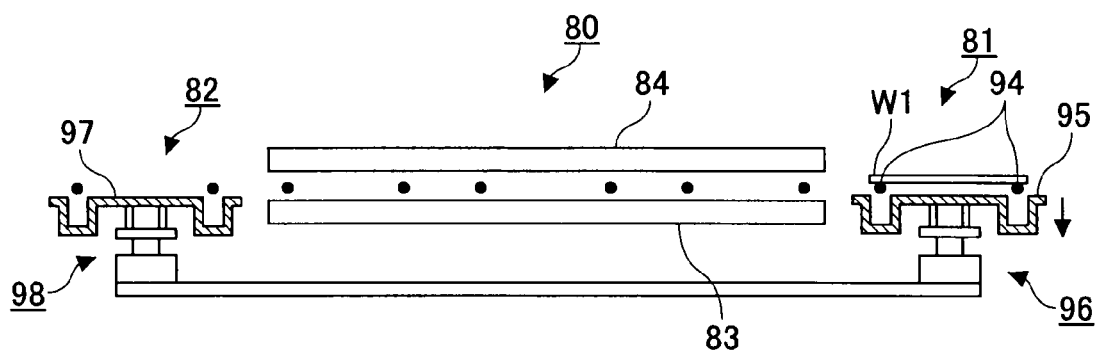
Figure 14C:
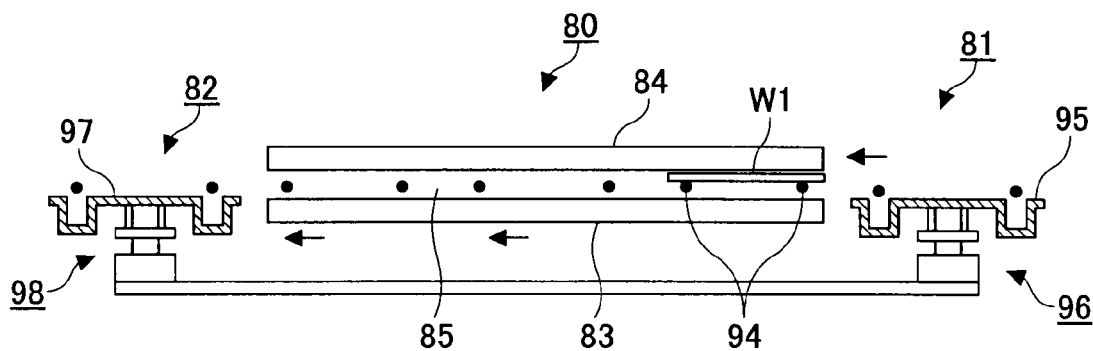

That is, first, as shown in FIG. 14A, the wafer W1 is transferred onto the first cooling plate 95 in the above-described manner, and thereafter, as shown in FIG. 14B, the first cooling plate 95 is moved down so as to transfer the wafer W1 on the first cooling plate 95 onto the wires 94. Then, the first cooling plate 95 is further lowered, and the wires 94 holding the wafer W are moved to the heating region 80 side as shown in FIG. 14C. The heating space 85 of the heating region 80 is heated with the heat plates 83 and 84 so that the temperature inside the heating space 85 is, for example, approximately 100° C. before the wafer W is conveyed in with the wires 94.

When the wafer W1 is conveyed into the heating space 85, being held by the wires 94, the valve V1 is opened so that a purge gas is fed from the gas source 86c to the gas feed pipe 86b. The purge gas is heated to approximately 100° C. in the gas ejection part 86, and is ejected toward inside the heating space 85 from ejection openings (not graphically illustrated). Substantially at the same time with the start of the ejection of the purge gas from the ejection openings, the valve V2 is opened so that the heating space 85 is exhausted through the exhaust part 87 by the exhauster 87c.

Thus, as indicated by arrows in FIG. 12, the purge gas fed from the gas ejection part 86 flows from the left side to the right side of the wafer W (W1) in a view from the carrying-out transfer part 82 side between the heat plate 84 and the heat plate 83 provided on the upper side and the lower side, respectively, of the heating space 85, and after passing by the wafer W, flows into the exhaust part 87 to be removed out of the processing container 300. The wafer W is moved in the heating space 85 while being held by the wires 94, and although not in direct contact with the heat plate 83 or 84, the wafer W is vertically heated with the heat plates 83 and 84 through the heating space 85 formed of a heat-transferring material while the heated purge gas flows along the surfaces of the wafer W, so that it is possible to heat the wafer W at a preset process temperature.

Here, gas flow that is wide enough to cover the width of the wafer W is formed and ejected from the gas ejection part 86 provided on one side of the heating space 85, and the suction exhaust openings (not graphically illustrated) provided on the other side of the heating space 85 are also configured to be wide enough to cover the width of the wafer W. Accordingly, unidirectional gas flow wide enough to cover the width of the wafer W is formed around the wafer W. Thus, the resist liquid applied on the wafer W is heated and dried with the heat of the heat plates 83 and 84 and the unidirectional gas flow, so that a resist film is formed on the wafer W.

Figure 14D:
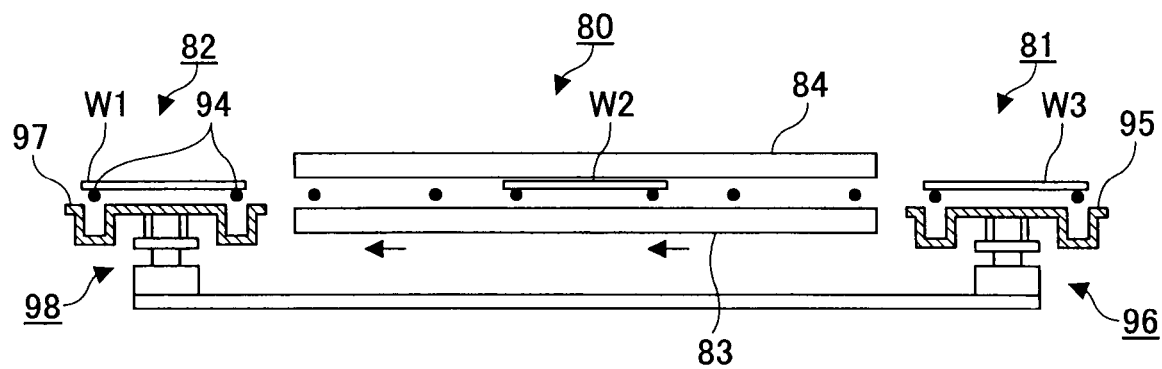

The wafer W1 thus subjected to heat treatment while moving inside the heat region 80 temporarily stops moving at the carrying-out transfer part 82 as shown in FIG. 14D. That is, the wires 94 holding the wafer W1 are stopped at the second transfer position. In FIGS. 14A and 14B, W2 indicates a wafer subsequent to the wafer W1, and W3 indicates a wafer subsequent to the wafer W2. Thus, the wafers W are successively transferred from the main arm A12 onto the carrying-in transfer part 81 in a predetermined timed manner.

Figure 14E:
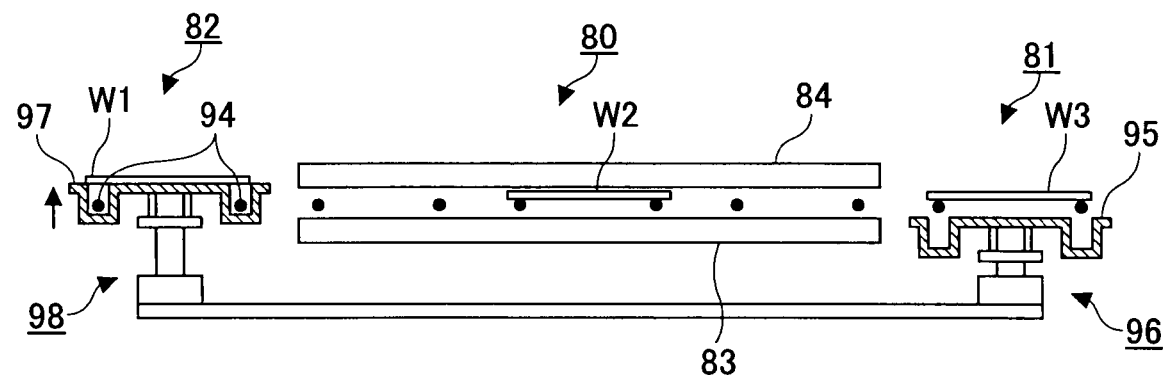

Then, as shown in FIG. 14E, the second cooling plate 97 is moved up so that the wafer W1 is cooled with the second cooling plate 97 with the second cooling plate 97 being in contact with the lower surface of the wafer W1 or with a gap of, for example, approximately 0.1 mm formed between the upper surface of the second cooling plate 97 and the lower surface of the wafer W1, thereby roughly removing the heat of the wafer W1. After rough removal of the heat is completed, the wafer W1 is transferred to the main arm A11 as described above through the second cooling plate 97, and is conveyed to the conveyance region R1 through the carrying-out opening 302 of the processing container 300. Here, in order to ensure a predetermined heating period, the length of the heating region 80 in the moving direction of the wafer W1 may be adjusted or the moving speed of the wafer W1 may be controlled.

Thus, in this heating module PEB, the wafers W are successively transferred from the main arm A12 to the carrying-in transfer part 81 in a predetermined timed manner. The wafer W transferred to the carrying-in transfer part 81 is heated as described above while being moved in the heating region 80, and then conveyed to the carrying-out transfer part 82. The heated wafers W are successively conveyed into the carrying-out transfer part 82 in a predetermined timed manner, so as to be transferred to the main arm A11 in a predetermined timed manner.

Next, a description is given, with reference to, for example, FIG. 2 through FIG. 6, of the conveyance path of the wafer W in this resist pattern forming apparatus.

The wafer W is conveyed by the control part 7 controlling the main arms A11, A12, A2, and A3, the transfer arm C, the transfer arm D, the shuttle arm E, and the interface arm F based on a conveyance flow (conveyance path) recipe.

First, the wafer W inside the carrier 20 carried from outside into the carrier block S1 is transferred to the transfer module TRS11 of the shelf unit U1 by the transfer arm C. The wafer W in the transfer module TRS11 is conveyed by the transfer arm D to the transfer module TRS12 or the transfer module TRS13, from which the wafer W is received by the main arm A2 of the COT1 layer B2 or the main arm A3 of the COT2 layer B3. In the COT1 layer B2 or the COT2 layer B3, the wafer W is conveyed by the corresponding main arm A2 or A3 from the temperature adjusting module CPL to the coating module COT to the heating module LHP to the edge exposure unit WEE, so that a resist film is formed on the wafer W.

The wafer W having the resist film formed thereon is transferred by the corresponding main arm A2 or A3 from the COT1 layer B2 or the COT2 layer B3 to the transfer module TRS12 or the transfer module TRS13, from which the wafer W is conveyed to the transfer module 10 by the transfer arm D. Next, the wafer W is moved in the DEV layer B1 by the shuttle arm E to be conveyed to the transfer module TRS20 of the shelf unit U3. Then, the wafer W is received from the transfer module TRS20 by the interface arm F to be conveyed to the exposure unit S4, where the wafer W is subjected to predetermined exposure.

Next, a description is given, with reference to, for example, FIG. 2, FIG. 4, and FIG. 7, of the conveyance path of the wafer W after exposure.

The wafer W after exposure is conveyed by the interface arm F to the transfer module TRS21 of the shelf unit U3, from which the wafer W is received into the DEV layer B1 by its main arm A12. Next, the wafer W is conveyed by the main arm A12 to the carrying-in transfer part 81 of the heat module PEB, where the wafer W is heated as described above. Thereafter, the wafer W is received from the carrying-out transfer part 82 by the main arm A11. Then, the wafer W is conveyed from the main arm A11 to the transfer unit 50 to the main arm A12 to the cooling module COL. Next, the wafer W is conveyed to the development module DEV3 or DEV4 or conveyed from the main arm A12 to the transfer unit 50 to the main arm A11 to the development module DEV1 or DEV2, so that development is performed.

The wafer W subjected to development in the development module DEV3 or DEV4 is transferred by the main arm A12 to the carrying-in transfer part 81 of the heating module POST, where the wafer W is heated as described above. On the other hand, the wafer W subjected to development in the development module DEV1 or DEV2 is conveyed from the main arm A11 to the transfer unit 50 to the main arm A12 to the carrying-in transfer part 81 of the heating module POST, where the wafer W is heated as described above.

Thereafter, the wafer W is received from the carrying-out transfer part 82 of the heating module POST by the main arm A11, and then conveyed from the main arm A11 to the temperature adjusting module CPL to the main arm A11 to the transfer module TRS11 of the shelf unit U1. Thus, the wafer W subjected to all processing is returned through the transfer module TRS11 to its original carrier 20 placed in the carrier block S1 by the transfer arm C.

In this resist pattern forming apparatus, it is possible to increase throughput because the heating modules PEB and POST having the above-described configuration are provided in the DEV layer B1. That is, in the heating modules PEB and POST, the wafers W are successively carried in from the main arm A12 through the carrying-in transfer part 81 in a predetermined timed manner, and the carried-in wafers W are subjected to predetermined heat treatment while being moved in the heating region 80. Then, the wafers are moved to the carrying-out transfer part 82, from which the wafers W are successively received by the main arm A11.

Here, the heating modules PEB and POST according to this embodiment are sized so as to allow three wafers W to be arranged in their moving direction in the heating region 80. Accordingly, compared with the case of arranging three conventional heating modules side by side in terms of throughput, since substantially the same time is required for heat treatment in each case, the heating modules PEB and POST according to this embodiment yield higher throughput by successively carrying in the wafers W through the carrying-in transfer part 81 in timing with completion of heating a single wafer W in the heating modules PEB and POST than in the case of performing processing using three conventional heating modules.

That is, according to the heating modules PEB and POST of this embodiment, processing is performed while moving the wafers W, so that it is possible to successively heat the wafers W without interruption by successively carrying in the wafers W through the carrying-in transfer part 81 in the above-described predetermined timed manner. On the other hand, the conventional method using three heating modules requires the steps of carrying out processed wafers and carrying in unprocessed wafers with a main arm, and cannot perform heat treatment during the time of performing these steps, thus resulting in reduced throughput.

Further, according to heating modules of the conventional configuration, wafers W are transferred to and from each heating module with a main arm. Accordingly, if three heating modules are arranged, the main arm has three access points. On the other hand, according to this embodiment, each of the heating modules PEB and POST has the carrying-in transfer part 81 and the carrying-out transfer part 82, so that each of the main arms A11 and A12 has two access points. Thus, the number of main arm access points is reduced, so that the workloads on the main arms A11 and A12 are reduced. In this respect also, it is possible to increase throughput.

Further, according to this embodiment, the two main arms A11 and A12 are provided so that carrying-out of the wafer W from and carrying-in of the wafer W into each of the heating modules PEB and POST are performed by the separate main arms A11 and A12, respectively. This further reduces the workloads on the main arms A11 and A12. That is, the main arms A11 and A12 do not have to move in the directions of the length of the conveyance region R1 (the directions of the Y-axis), so that the time of conveyance is reduced by the time for this movement. Further, since the main arm A12 only carries in the wafer W and the other main arm A11 only carries out the wafer W, the number of operation steps of the main arm A12 is reduced compared with the case of carrying in unprocessed wafers W after carrying out processed wafers as conventionally performed.

Here, it is assumed that two main arms are employed to transfer wafers in conventional heating modules. However, since the conventional heating modules have a large number of main arm access points and require unprocessed wafers to be carried in after processed wafers are carried out as described above, the number of operation steps of the main arms is more than that of the main arms A11 and A12 of this embodiment, so that the workloads are heavier on the conventional main arms than on the main arms A11 and A12 of this embodiment.

Further, according to this embodiment, using the length of the conveyance region R1 of the DEV layer B1, the moving direction of the wafer W in the heating modules PEB and POST is aligned with the lengthwise directions of the conveyance region R1. Accordingly, even if the heating modules PEB and POST are larger in size in their lengthwise directions, the heating modules PEB and POST are satisfactorily arranged in the DEV layer B1 without increasing the size of the unit block B1.

Further, the main arm A12 and the main arm A11 are placed on the interface block S3 side and on the carrier block S1 side, respectively; a pre-processing module that performs pre-processing of development is provided in a region of the shelf unit U2 which region is accessed by the main arm A12 on the interface block S3 side, and a post-processing module that performs post-processing of development is provided in a region of the shelf unit U2 which region is accessed by the main arm A11 on the interface block S1 side; and the carrying-in transfer part 81 and the carrying-out transfer part 82 of each of the heating modules PEB and POST are provided on the interface block S3 side and on the carrier block S1 side, respectively. Accordingly, the conveyance path in the case of conveyance from the interface block S3 to the heating module PEB, conveyance from the heating module POST to the temperature adjusting module CPL, and conveyance from the temperature adjusting module CPL to the carrier block S1 is reduced, so that conveyance is smoothly performed. Therefore, it is possible to expect a further increase in throughput.

Figure 15:
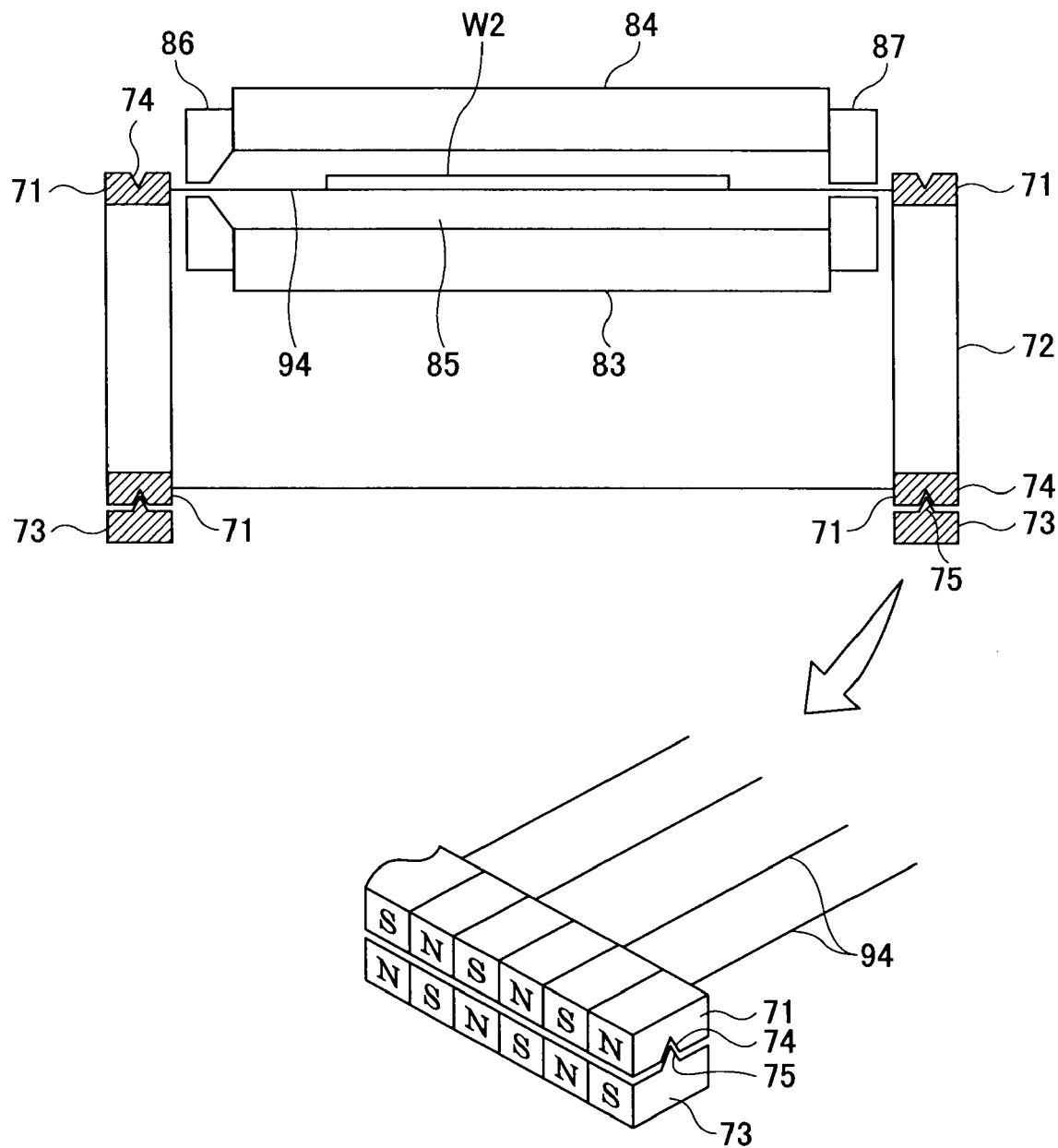
FIG. 15 is a diagram showing another example of the heating module according to the embodiment of the present invention.

Next, a description is given, with reference to FIG. 15, of a variation of this embodiment.

This variation is different from the above-described embodiment in that timing belts 71 of the wires 94 are caused to revolve along an orbit by a linear motor. In this case, the drive pulleys of the above-described rotary body 91 are replaced with first pulleys 72, and the driven pulleys of the above-described rotary body 92 are replaced with second pulleys (not graphically illustrated), so that the timing belts are engaged with and extended between the first pulleys 72 and the second pulleys. The first pulleys 72 and the second pulleys are equal in position and size to the rotary body 91 and 92, respectively, of the above-described conveyance path member 9.

Each of the timing belts 71 has electromagnets provided on at least its exterior surface with their north poles and south poles alternating with each other. Further, motor magnets 73 for moving the timing belts 71 are provided in part of the orbit of the timing belts 71, for example, in the lower linear part of the orbit. The motor magnets 73 are provided so as to face the timing belts 71 with a slight gap therebetween when the timing belts 71 move. The motor magnets 73 are formed of electromagnets that are arranged with their north poles and south poles alternating with each other. The polarity of the electromagnets switches, and the switching of the polarity is controlled by the control part 7 (FIG. 2). Further, each of the timing belts 71 has, for example, a V-shaped recess 74 formed on its surface facing the corresponding motor magnets 73, while each of the motor magnets 73 has a projecting part 75 formed on its surface facing the corresponding timing belt 71. The projecting part 75 has a shape that fits the shape of the recess 74 of the timing belt 71.

According to this configuration, by energizing the motor magnets 73 and switching the polarity of the motor magnets 73, the timing belts 71 are caused to revolve along the orbit slightly above the motor magnets 73 by the action of magnetic attraction and adhesion and magnetic repulsion and by the rotations of the first pulleys 72 and the second pulleys. That is, the timing belts 71 are driven by the motor magnets 73 out of contact with the motor magnets 73.

Figure 16:
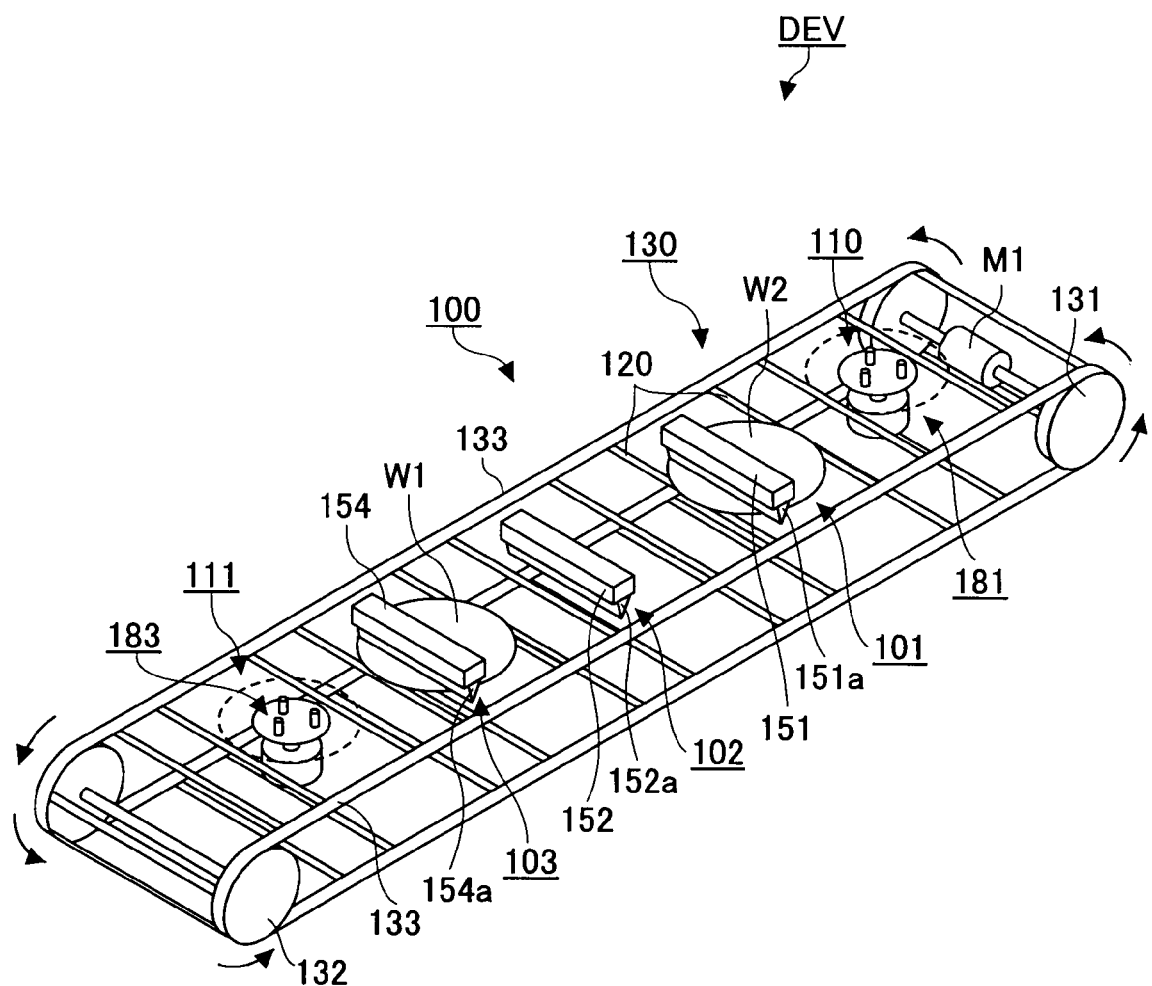
FIG. 16 is a perspective view of another example of a development module provided in the coater/developer according to the embodiment of the present invention.
Figure 17:
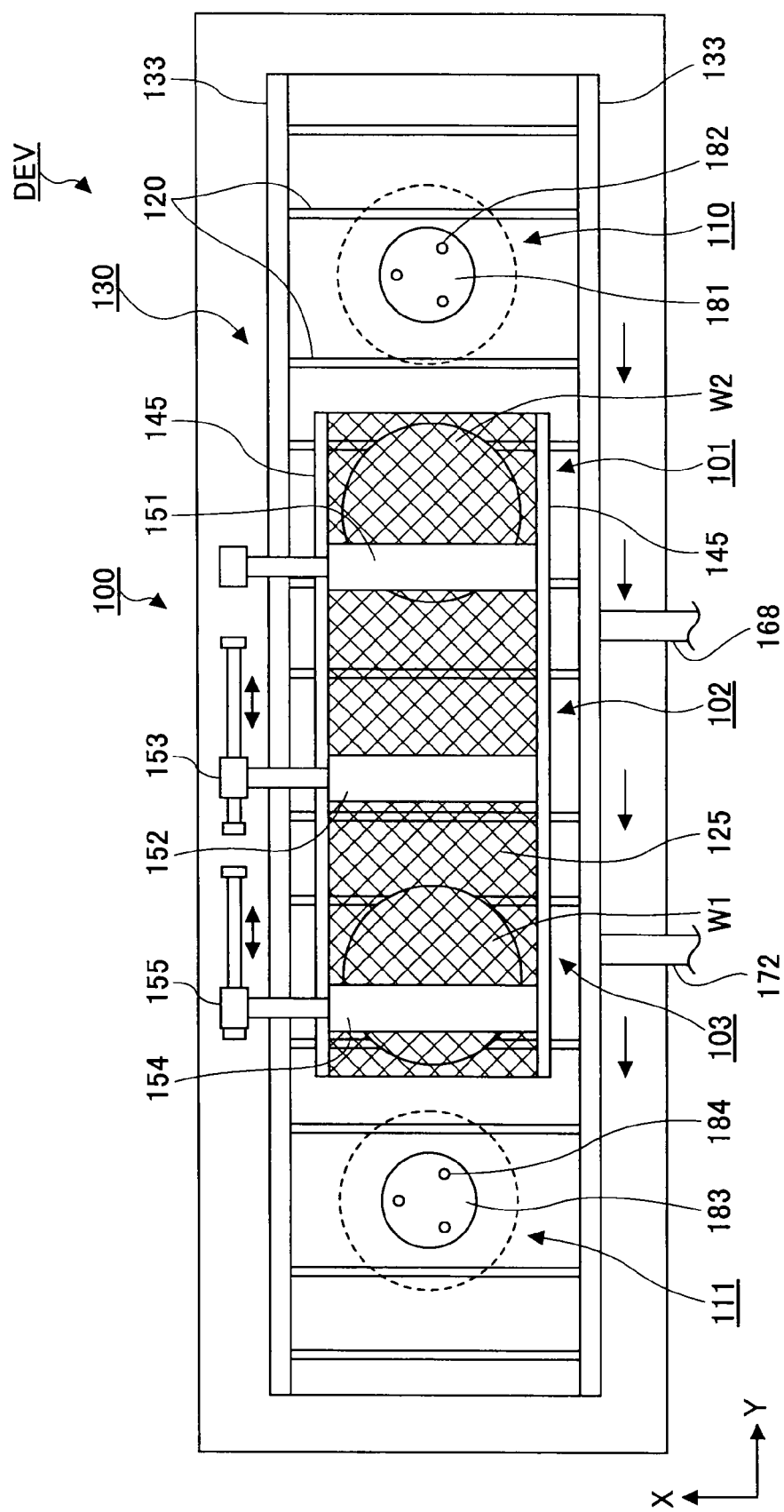
FIG. 17 is a plan view of the development module of FIG. 16 according to the embodiment of the present invention.
Figure 18:
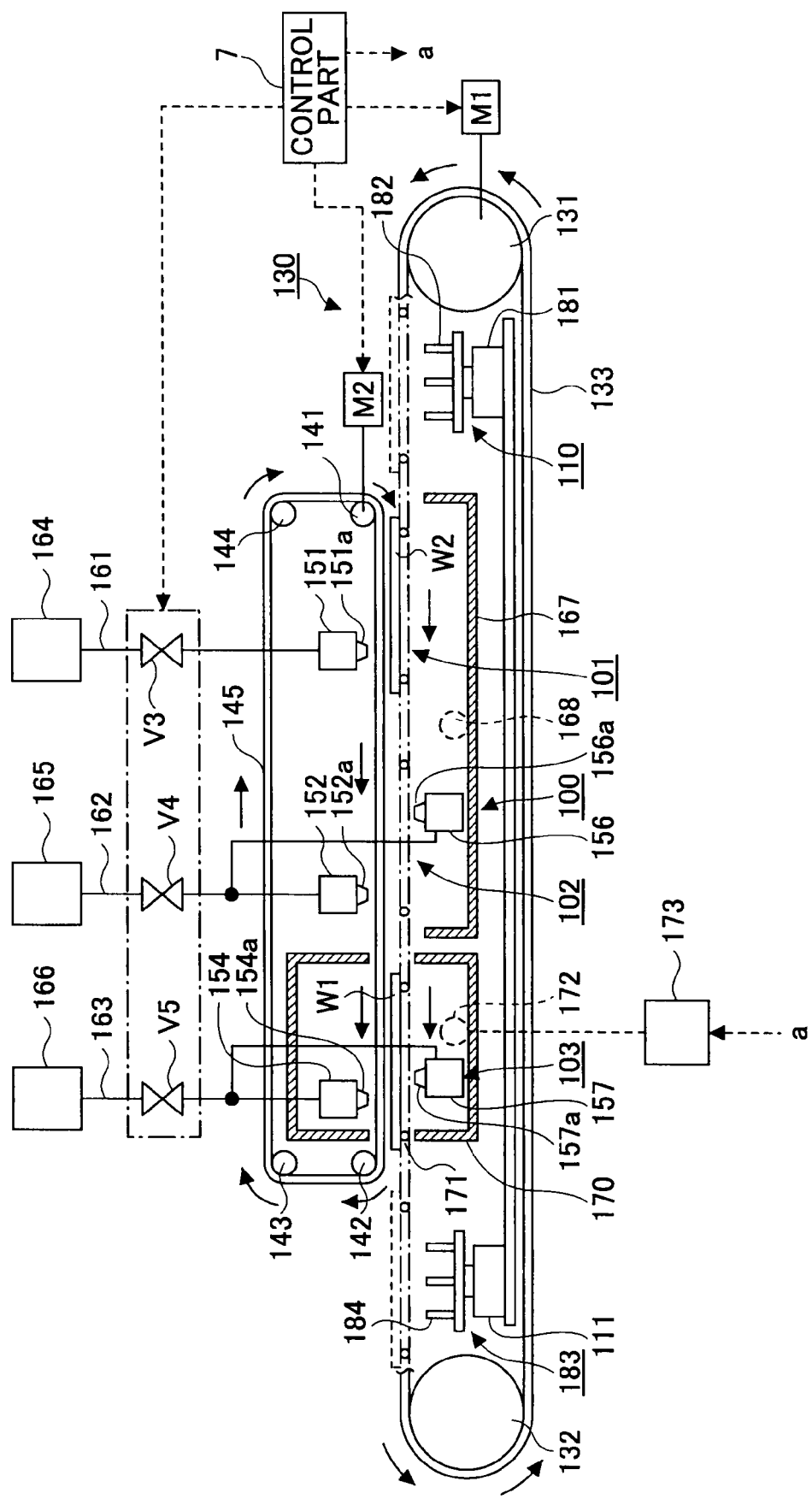
FIG. 18 is a cutaway view of the development module of FIG. 16 according to the embodiment of the present invention.

Next, a description is given, with reference to FIGS. 16 through FIG. 18, of another example of the development module provided in the DEV layer B1 according to this embodiment. A development module DEV includes a processing region 100 for performing development on the wafer W, the processing region 100 extending along the directions of the length of the DEV layer B1 (the directions of the Y-axis in FIG. 16 and FIG. 17); a carrying-in transfer part 110 provided at one end side of the processing region 100 in its lengthwise directions; and a carrying-out transfer part 111 provided at the other end side of the processing region 100 in its lengthwise directions. The carrying-in transfer part 110 is provided in a region accessed by the main arm A12 on the interface block S3 side, and the carrying-out transfer part 111 is provided in a region accessed by the main arm A11 on the carrier block S1 side.

The processing region 100 is sized in its lengthwise directions so as to allow multiple, for example, three wafers W to be arranged in the directions of the length of the DEV layer B1, for example. The processing region 100 is sized in its widthwise directions (the directions of the X-axis in FIG. 16 and FIG. 17) so as to be suitable for performing development on a single wafer W, for example. The processing region 100 has a development region 101, a cleaning region 102, and a drying region 103 provided therein in this order from the interface block S3 side toward the carrier block S1 side. The size of each of the development region 101, the cleaning region 102, and the drying region 103 in its lengthwise directions is determined so as to allow placement of a single wafer W.

The wafer W is conveyed in the processing region 100 in its lengthwise directions from the interface block S3 side toward the carrier block S1 side while being on a conveyance path member 130. The conveyance path member 130 is engaged with and extended between a pair of rotary bodies 131 and 132 so as to move along a first orbit. The rotary bodies 131 and 132 rotate about their respective horizontal axles, and are spaced apart from each other in the lengthwise directions of the development module DEV with their rotational axles being parallel to each other. In this manner, the conveyance path member 130 forms part of the conveyance path of the wafer W from the interface block S3 to the carrier block S1. Specifically, the conveyance path member 130 includes multiple rod-shaped conveyance members 120 that extend parallel to the rotational axles of the rotary bodies 131 and 132 and on which the wafer W is placed, and a pair of timing belts 133 that are connected to both ends of the conveyance members 120 and move along the first orbit. The timing belts 133 are wound around and extended between the rotary bodies 131 and 132.

Each of the conveyance members 120 is formed of, for example, a rod-shaped body of ceramic or resin such as polytetrafluoroethylene having a cross section shaped like a circle or a polygon such as a triangle. The length of each conveyance member 120 is determined so as to cover the length of the processing region 100 in its widthwise directions as shown in, for example, FIG. 17. The size of the cross section of each conveyance member 120 is, for example, approximately 7 mm in diameter in the case of a circular cross section. In this case, the bottom-side edge part (periphery) of the wafer W is supported by paired two of the conveyance members 120.

The paired rotary bodies 131 and 132 are provided so that their rotational axles extend parallel to each other in the directions of the width of the processing region 100. The length of the rotary bodies 131 and 132 is determined so as to cover the width of the processing region 100. The rotary bodies 131 and 132 are provided so as to face each other across the processing region 100 so that the rotary body 131 is positioned on the upstream side of the carrying-in transfer part 110 in the wafer conveying (moving) direction (from right to left in FIG. 17) and the other rotary body 132 is positioned on the downstream side of the carrying-out transfer part 111 in the wafer conveying direction. Thus, the carrying-in transfer part 110 is provided at the upstream end of the conveyance path formed by the conveyance path member 130, and the carrying-out transfer part 111 is provided at the downstream end of the conveyance path.

Referring to FIG. 16 and FIG. 18, the rotary body 131 is formed of, for example, drive pulleys rotated by a motor M1, and the rotary body 132 is formed of driven pulleys. The timing belts 133 are wound around the corresponding lengthwise ends of the rotary bodies 131 and 132, and the pairs of conveyance members 120 are provided on the timing belts 133 at predetermined intervals.

Thus, by rotating the rotary bodies 131 and 132, the conveyance members 120 move along the first orbit so as to move from the carrying-in transfer part 110 to the carrying-out transfer part 111 through the processing region 100 and then return to the carrying-in transfer part 110 again. FIG. 16 is a perspective view for illustrating the conveyance path member 130, in which a below-described mesh belt 125 (FIG. 17) and members provided inside the orbit of the timing belts 133 are omitted for convenience of graphical representation.

Referring to FIG. 17, the mesh belt 125 is provided above the wafer W placed on the conveyance members 120 and moving in the processing region 100, so as to move along a second orbit in synchronization with the conveyance members 120. The mesh belt 125 is a mesh cloth-like body formed of, for example, nylon-polytetrafluoroethylene fibers. The mesh belt 125 is approximately 0.15 mm in thickness, and has openings of approximately 1.0 mm×1.0 mm in size. The mesh belt 125 is sized in its widthwise directions so as to completely cover the wafer W. Further, the mesh belt 125 is provided so as to cover the entire processing region 100 with the lower surface of the mesh belt 125 being positioned, for example, approximately 1.7 mm above the surface of the conveyance members 120.

Referring to FIG. 18, this mesh belt 125 is engaged with and extended between rotary bodies 141, 142, 143, and 144 so as to move along the second orbit. The rotary bodies 141, 142, 143, and 144 rotate about their respective horizontal axles and are placed so that their rotational axles are parallel to one another. The rotary bodies 141, 142, 143, and 144 are provided so that their respective rotational axles extend parallel to one another in the widthwise directions of the processing region 100. Further, the length of the rotary bodies 141, 142, 143, and 144 is adjusted to the width of the mesh belt 125.

When the wafer W is transferred between the main arm A11 and the carrying-out transfer part 111 or between the main arm A12 and the carrying-in transfer part 110, the mesh belt 125 moves in such a manner as to not interfere with this transfer operation. Therefore, the rotary body 141 is provided, for example, on the downstream side of a work region where the wafer W is transferred between the main arm A12 and the carrying-in transfer part 110 in the wafer conveying direction, and the rotary body 142 is provided, for example, on the upstream side of a work region where the wafer W is transferred between the main arm A11 and the carrying-out transfer part 111 in the wafer conveying direction, so as to face the rotary body 141 in the lengthwise directions of the processing region 100.

The rotary body 143 is provided above the rotary body 142 so as to face the rotary body 142, and the rotary body 144 is provided above the rotary body 141 so as to face the rotary body 141. Here, referring to FIG. 18, the rotary body 141 is formed of drive pulleys rotated by a motor M2, and the rotary bodies 142 through 144 are formed of driven pulleys. Timing belts 145 are wound around the corresponding lengthwise ends of the rotary bodies 141 through 144. In FIG. 18, the motors M1 and M2 are shown separately from the rotary bodies 131 and 141, respectively, for convenience of graphical representation. In practice, however, the motor M2 is provided between a pair of drive pulleys so as to be connected thereto the same as the motor M1 of the rotary body 131 (FIG. 16).

For example, the mesh belt 125 has both of its end sides in its widthwise directions attached to the corresponding timing belts 145. Here, the drive pulleys and driven pulleys forming the rotary bodies 141 through 144 are toothed pulleys, while the timing belts 145 include holes (not graphically illustrated) corresponding to the toothed pulleys so as to also serve as feeding guides.

The driving of the motor M1 of the rotary body 131 of the conveyance path member 130 and the driving of the motor M2 of the rotary body 141 that revolves the mesh belt 125 are controlled by the control part 7, so that the timing belts 133 of the conveyance path member 130 and the timing belts 145 of the mesh belt 125 revolve in synchronization with each other. As a result, the mesh belt 125 is provided so as to move along the second orbit in synchronization with the movement of the conveyance members 120 that move along the first orbit. Here, the phrase "in synchronization with each other" means to move the mesh belt 125 in the same moving direction and at the same moving speed as the conveyance members 120 in timing with the movement of the conveyance members 120. Since the movements of the wafer W and the mesh belt 125 are thus synchronized, developer is likely to be held on the wafer W without spilling from the wafer W so that it is possible to prevent the developer from flowing on the wafer W even when the wafer W is moved after being fed with the developer.

The development region 101 is provided with a development nozzle 151 for feeding the upper surface of the wafer W placed on the conveyance members 120 with developer through the mesh belt 125 when the wafer W moves through the development region 101. The development nozzle 151 has a developer ejection region 151a provided at its end. The length of the developer ejection region 151a is greater than or substantially equal to the diameter of the wafer W. The development nozzle 151 is provided so that its lengthwise directions are aligned with the widthwise directions of the processing region 100 and the end of the development nozzle 151 is positioned approximately 2 mm above the surface of the wafer W placed on the conveyance members 120.

The cleaning region 102 is provided with a first cleaning nozzle 152 and a second cleaning nozzle 156 for feeding the upper surface and the lower surface, respectively, of the wafer W placed on the conveyance members 120 with cleaning liquid such as pure water (through the mesh belt 125 in the case of the first cleaning nozzle 152) when the wafer W moves through the development region 101. The cleaning nozzles 152 and 156 have cleaning liquid ejection regions 152a and 156a provided at their respective ends. The length of each of the cleaning liquid ejection region 152a and 156a is greater than or substantially equal to the diameter of the wafer W. The cleaning nozzles 152 and 156 are provided so that their lengthwise directions are aligned with the widthwise directions of the processing region 100 and the end of the cleaning nozzle 152 is positioned approximately 2 mm above the surface of the wafer W placed on the conveyance members 120.

As shown in, for example, FIG. 17, the first cleaning nozzle 152 is provided so as to be movable in the lengthwise directions of the processing region 100 by a first movement mechanism 153 within the range of the cleaning region 102, so that the upper surface of the wafer W can be cleaned by moving the cleaning nozzle 152 back and forth multiple times, for example. The second cleaning nozzle 156 may be fixed at a position within the range of the cleaning region 102 or be provided so as to be movable in the lengthwise directions of the processing region 100 within the range of the cleaning region 102.

Further, the drying region 103 is provided with a first gas nozzle 154 and a second gas nozzle 157 for feeding the upper surface and the lower surface, respectively, of the wafer W placed on the conveyance members 120 with gas serving as an air knife that dries the surface, such as dry air or an inert gas such as a nitrogen gas, when the wafer W moves through the drying region 103. The gas nozzles 154 and 157 have gas ejection regions 154a and 157a provided at their respective ends. The length of each of the gas ejection region 154a and 157a is greater than or substantially equal to the diameter of the wafer W. The gas nozzles 154 and 157 are provided so that their lengthwise directions are aligned with the widthwise directions of the processing region 100 and the end of the gas nozzle 154 is positioned approximately 1 mm above the surface of the wafer W placed on the conveyance members 120.

As shown in, for example, FIG. 17, the first gas nozzle 154 is provided so as to be movable in the lengthwise directions of the processing region 100 by a second movement mechanism 155 within the range of the drying region 103. The second gas nozzle 157 may be fixed at a position within the range of the drying region 103 or be provided so as to be movable in the lengthwise directions of the processing region 100 within the range of the drying region 103.

The development nozzle 151, the first and second cleaning nozzles 152 and 156, and the first and second gas nozzles 154 and 157 are provided, for example, inside the second orbit of the mesh belt 125, and are connected to a developer feed part 164, a cleaning liquid feed part 165, and a drying gas feed part 166 through feed paths 161, 162, and 163 with flow rate control valves V3, V4, and V5, respectively, in such a manner as to not interfere with the revolution of the mesh belt 125. The flow rate control valves V3 through V5 are controlled by the control part 7.

Further, a liquid receiver part 167 for collecting developer or cleaning liquid fed to the development region 101 or the cleaning region 102 is provided below the conveyance members 120 in the development region 101 and the cleaning region 102. In this case, the liquid receiver part 167 is provided so as to be positioned below the second cleaning nozzle 156 inside the first orbit of the conveyance members 120. A drain path 168 is connected to the liquid receiver part 167 in such a manner as to not interfere with the revolution of the conveyance members 120.

The drying region 103 is covered with a processing container 170 in order to accelerate the drying of the wafer W. The processing container 170 is configured to enclose the wafer W when the wafer W passes the drying region 103. A gap 171 is formed in a region where the wafer W passes in the processing container 170 so as to allow the wafer W to move through the processing container 170 while being on the conveyance members 120. An exhaust path 172 is connected to the processing container 170 in such a manner as to not interfere with the revolution of the conveyance members 120. The other end of the exhaust path 172 is connected to an exhaust pump 173, and pressure control is performed based on a command from the control part 7 so that the pressure inside the processing container 170 is negative.

The carrying-in transfer part 110 has a first elevation pin mechanism 181 provided, for example, inside the first orbit of the conveyance members 120. The first elevation pin mechanism 181 is used to transfer the wafer W from the main arm A12 onto the conveyance members 120. The first elevation pin mechanism 181 includes elevation pins 182 configured to be movable up and down so that their respective ends project through the conveyance members 120 to be above the holding arms 51 and 52 through the region inside the holding arms 51 and 52 when the main arm A12 moves in to a transfer position where the main arm A12 transfers the wafer W to the carrying-in transfer part 110, and after the wafer W is placed on the conveyance members 120, move down to be below the conveyance members 120 on which the wafer W is placed.

Further, the carrying-out transfer part 111 is configured in the same manner as the carrying-in transfer part 110, and includes a second elevation pin mechanism 183 provided, for example, inside the first orbit of the conveyance members 120. The second elevation pin mechanism 183 is used to transfer the wafer W from the conveyance members 120 to the main arm A11. Like the first elevation mechanism 181, the second elevation mechanism 183 includes elevation pins 184 configured to be movable up and down.

Next, a description is given of development performed in this development module DEV. First, the conveyance members 120 are stopped at a transfer position, and the wafer W1 is transferred from the main arm A12 onto the carrying-in transfer part 110. Here, the transfer position of the conveyance members 120 is where the wafer W1 is placed at a predetermined position on paired two of the conveyance members 120 and the elevation pin mechanism 181 of the carrying-in transfer part 110 is positioned between the two conveyance members 120.

The wafer W1 is transferred by, for example, causing the main arm A12 holding the wafer W1 to travel to be above the carrying-in transfer part 110; then causing the elevation pins 182 of the elevation pin mechanism 181 to move up to be above the conveyance members 120 and receive the wafer W1 from the main arm A12; and then causing the elevation pins 182 to move down to be below the conveyance members 120 after causing the main arm A12 to recede, and transferring the wafer W1 onto the conveyance members 120.

After thus transferring the wafer W1 onto the conveyance members 120, the motor M1 and the motor M2 are put into operation so as to cause the conveyance members 120 and the mesh belt 125 to move from the interface block S3 side toward the carrier block S1 side at a predetermined speed. Then, in the processing region 100, first, developer is fed at a predetermined flow rate from the development nozzle 151 to the upper surface of the wafer through the mesh belt 125 in the development region 101 while the wafer W is moving. At this point, although the development nozzle 151 does not move, the entire upper surface of the wafer W1 is fed with the developer and development is performed because of the movement of the wafer W1.

Then, the wafer W1 fed with the developer moves on to the cleaning region 102. At this point, the wafer W1 moves with the developer on the upper surface of the wafer W1 being held between the wafer W1 and the mesh belt 125. Here, in order to ensure a predetermined development period, for example, a development period of approximately 60 seconds, the length of the development region 101 in the moving direction of the wafer W1 may be adjusted, the moving speed may be controlled, or the movement of the wafer W1 may be temporarily stopped after feeding the developer.

In the cleaning region 102, while the wafer W1 is moving, cleaning liquid is fed at a predetermined flow rate from the first cleaning nozzle 152 through the mesh belt 125 onto the upper surface of the wafer W1, subjected to development for a predetermined period of time, thereby washing away the developer on the upper surface of the wafer W1, and cleaning liquid is fed from the second cleaning nozzle 156 to the lower surface of the wafer W1, thereby washing away the developer adhering to the lower surface of the wafer W1. Here, the first cleaning nozzle 152 feeds the cleaning liquid while moving along the moving direction of the wafer W1 in the cleaning region 102. At this point, in the cleaning process, all the developer on the surfaces of the wafer W1 is washed away. In order to ensure cleaning, the length of the cleaning region 102 in the moving direction of the wafer W1 may be adjusted, the feed flow rate of cleaning liquid may be controlled, or the moving speed may be controlled.

Next, the wafer W1 moves to the drying region 103. In the drying region 103, while the wafer W is moving, drying gas is blown at a predetermined rate against the upper surface of the cleaned wafer W1 from the first gas nozzle 154 through the mesh belt 125, thereby drying the upper surface of the wafer W1, and drying gas is fed from the second gas nozzle 157 to the lower surface of the wafer W1, thereby drying the lower surface of the wafer W1, in the processing container 170 set at a negative pressure. Here, the first gas nozzle 154 blows drying gas while moving along the moving direction of the wafer W1 in the processing container 170. At this point, in the drying process, the surfaces of the wafer W1 are dried. In order to ensure drying, the length of the drying region 103 in the moving direction of the wafer W1 may be adjusted, or the pressure inside the processing container 170 may be controlled. Alternatively, the number of first gas nozzles 154 or second gas nozzles 157 may be increased, the blowing flow rate of drying gas may be controlled, or the moving speed may be controlled.

Thereafter, the wafer W1 moves to the carrying-out transfer part 111 to be transferred to the main arm A11. In this transfer, first, the conveyance members 120 are stopped at a transfer position. This transfer position of the conveyance members 120 is where the elevation pin mechanism 183 of the carrying-out transfer part 111 is positioned between the two conveyance members 120.

Then, the wafer W1 is transferred by, for example, causing the elevation pins 184 of the elevation pin mechanism 183 from below the conveyance members 120 on which the wafer W1 is placed and transferring the wafer W1 from the conveyance members 120 onto the elevation pins 184; then causing the main arm A11 to move up after causing the main arm A11 to enter between the conveyance members 120 and the elevation pins 184, thereby transferring the wafer W1 from the elevation pins 184 to the main arm A11; and thereafter causing the main arm A11 to recede and causing the elevation pins 184 to move down to be below the conveyance members 120.

Thus, in this development module DEV, the wafers W before development are successively transferred from the main arm A12 to the carrying-in transfer part 110 in a predetermined timed manner. The wafers W transferred to the carrying-in transfer part 110 have their upper surfaces fed with developer in the development region 101, have their surfaces cleaned in the cleaning region 102, and have their surfaces dried in the drying region 103 while moving from the upstream side to the downstream side in the processing region 100, and then are conveyed to the carrying-out transfer part 111. In the carrying-out transfer part 111, the wafers W subjected to development are successively transferred in a predetermined timed manner so as to be transferred to the main arm A11 in a predetermined timed manner. On the other hand, the conveyance members 120 are again returned to the carrying-in transfer part 110 after transferring the wafers W to the main arm A11.

Using this development module DEV makes it possible to perform development on multiple wafers W in a flow process, so that it is possible to successively perform development on the wafers W without interruption. Therefore, it is possible to increase throughput.

In the above, the DEV layer B1 may employ a single main arm configured to move along the lengthwise directions of the conveyance region R1 as the main arm A2 of the COT1 layer B2. Further, according to this embodiment, the number of the heating modules PEB or POST, the cooling modules COL, or the temperature adjusting modules CPL provided in the DEV layer B1 may be freely determined. Further, the heating module according to this embodiment may also be provided in the COT1 layer B2 or the like.

Further, the configuration of the heating modules POST and PEB, such as the size of the heating region 80, is not limited to the above-described example as long as the conveyance path member 9 forming the conveyance path of the wafer W moves along an orbit, the carrying-in transfer part 81 and the carrying-out transfer part 82 are provided at the upstream end and the downstream end, respectively, of the conveyance path, and at least one of the heat plates 83 and 84 for heating the wafer W is provided between the upstream end and the downstream end of the conveyance path. Further, the drive mechanism for moving the wires 94 along the orbit is not limited to the above-described example, either. Further, with respect to the heat plate, at least one of the upper heat plate 84 and the lower heat plate 83 is provided.

Further, providing the gas ejection part 86 and the exhaust part 87 makes it possible to perform heat treatment while forming so-called unidirectional gas flow, so that it is possible to reduce adhesion of particles of the sublimate of a resist to the wafer W. However, it is not always necessary to provide the gas ejection part 86 or the exhaust part 87.

Further, the configuration of the carrying-in transfer part 81 or the carrying-out transfer part 82 is not limited to the above-described example. Providing the carrying-in transfer part 81 with the first cooling plate 95 makes it possible to make uniform the temperatures of the wafers W before heating, thus having the advantage of being capable of uniformly heating multiple wafers W. However, it is not always necessary to provide the first cooling plate 95.

Further, the present invention is applicable not only in the case of forming only a resist film as a coating film but also in the case of forming an anti-reflection film on the upper side or the lower side of the resist film. Here, in the case of forming an anti-reflection film on and/or under the resist film, it is necessary to provide a unit block for forming the anti-reflection film, and this unit block is configured in the same manner as the above-described unit blocks for forming the resist film. Further, the present invention is also applicable in the case of forming a resist film and upper and lower anti-reflection films on and under the resist film as coating films. In this case, a processing block is formed by stacking a unit block for development, a unit block for forming the resist film, a unit block for forming the lower anti-reflection film on the lower side of the resist film, and a unit block for forming the upper anti-reflection film on the upper side of the resist film. Further, according to the present invention, if the processing block includes a unit block for forming a coating film and a unit block for development, the order of stacking unit blocks may be freely determined.

Further, modules other than those described above may be provided as processing modules in one or more of the shelf units U1, U2, and U3. Further, the number of transfer modules may be increased or modules configured to serve as a temperature adjusting mechanism and a transfer part may be provided as a transfer part in one or more of the shelf units U1 and U3. Further, a module that performs hydrophobicization and/or a test unit that tests the film thickness of a coating film or the deflection of the wafer W may be provided in one or more of the shelf units U1, U2, and U3.

Further, the present invention is also applicable to a coater/developer that processes not only semiconductor wafers but also substrates such as glass substrates for liquid crystal displays (LCD substrates).

According to one aspect of the present invention, in a heating module provided in a unit block for development, substrates are successively transferred from the substrate conveyance part of the unit block for development to the first transfer part of the heating module, and the substrates are successively moved to the downstream side. The substrates are heated while the substrates are being moved, and the heated substrates are successively transferred to the substrate conveyance part through the second transfer part of the heating module. Therefore, in the heating module, it is possible to heat the substrates in a flow process, so that it is possible to successively heat multiple substrates without interruption. Accordingly, it is possible to increase throughput. Further, a single heating module is accessed by the substrate conveyance part at two points, that is, the first transfer part and the second transfer part. Accordingly, the workload on the substrate conveyance part is reduced, so that it is possible to increase throughput.

The present invention is not limited to the specifically disclosed embodiment, and variations and modifications may be made without departing from the scope of the present invention.

The present application is based on Japanese Priority Patent Application No. 2007-119416, filed on Apr. 27, 2007, the entire contents of which are hereby incorporated by reference.

What is claimed is:

1. A coater/developer forming a coating film on a substrate in a first unit block provided at a stage subsequent to a carrier block into which the substrate has been carried with a carrier; thereafter conveying the substrate to an exposure unit through an interface block provided at a stage subsequent to the first unit block; and performing development in a second unit block on the substrate subjected to exposure in the exposure unit and returned therefrom through the interface block, and transferring the substrate to the carrier block, the second unit block being stacked on the first unit block and having a conveyance path of the substrate from the interface block to the carrier block, wherein:

the second unit block includes a development module configured to perform the development on the substrate, a heating module configured to heat the substrate before and after the development, a cooling module configured to cool the substrate after the heating, and a substrate conveyance part configured to transfer the substrate to and receive the substrate from the modules, and the heating module includes a pair of rotary bodies configured to rotate about respective horizontal axles, the rotary bodies being spaced apart from each other in a direction along the conveyance path of the substrate so that the rotational axles thereof are parallel to each other;

a conveyance path member engaged with and extended between the rotary bodies so as to move along an orbit, the conveyance path member forming a part of the conveyance path of the substrate placed on the conveyance path member;

a first transfer part provided at an upstream end of the conveyance path and configured to transfer the substrate between the substrate conveyance part and the conveyance path member;

a second transfer part provided at a downstream end of the conveyance path and configured to transfer the substrate between the substrate conveyance part and the conveyance path member; and a heating part provided between the upstream end and the downstream end of the conveyance path and configured to heat the substrate.

2. The coater/developer as claimed in claim 1, wherein the conveyance path member comprises:

a plurality of rod-shaped conveyance members on which the substrate is placed, the conveyance members extending parallel to the rotational axles of the rotary bodies; and a pair of timing belts connected to ends of the conveyance members so as to move along the orbit.

3. The coater/developer as claimed in claim 2, further comprising:

a motor configured to rotate at least one of the rotary bodies so as to cause the timing belts to move along the orbit.

4. The coater/developer as claimed in claim 3, wherein the heating part comprises:

a first heat plate provided below the conveyance path member so as to heat the substrate from a lower side thereof; and a second heat plate provided to face the first heat plate so as to heat the substrate from an upper side thereof.

5. The coater/developer as claimed in claim 3, wherein the substrate conveyance part comprises:

a first substrate conveyance part configured to transfer the substrate to the first transfer part; and a second substrate conveyance part configured to receive the substrate from the second transfer part.

6. The coater/developer as claimed in claim 3, wherein the second unit block comprises a shelf unit including the heating module, a plurality of pre-processing modules configured to process the substrate before the development, and a plurality of post-processing modules configured to process the substrate after the development, the shelf unit is provided so that the shelf unit faces the development module across the conveyance path of the substrate of the second unit block, and the heating module is provided so that the part of the conveyance path of the substrate formed by the conveyance path member of the heating module is along the conveyance path of the substrate of the second unit block, and that the first transfer part and the second transfer part are positioned on a side of the interface block and a side of the carrier block, respectively.

7. The coater/developer as claimed in claim 2, further comprising:

a motor magnet for causing the timing belts of the conveyance path member to move along the orbit, the motor magnet having north and south poles alternately arranged and having a polarity thereof switched, wherein the timing belts have electromagnets provided on at least exterior surfaces thereof, the electromagnets having north and south poles alternately arranged.

8. The coater/developer as claimed in claim 2, wherein the heating part comprises:

a first heat plate provided below the conveyance path member so as to heat the substrate from a lower side thereof; and a second heat plate provided to face the first heat plate so as to heat the substrate from an upper side thereof.

9. The coater/developer as claimed in claim 8, further comprising:

a gas ejection part provided on one of lateral sides of the conveyance path member in a moving direction thereof and configured to form gas flow wide enough to cover a width of the substrate by ejecting gas into a space between the first heat plate and the second heat plate; and a suction exhaust part provided on another one of the lateral sides of the conveyance path member in the moving direction thereof so as to be wide enough to cover the width of the substrate and configured to suction the gas from the space between the first heat plate and the second heat plate.

10. The coater/developer as claimed in claim 2, wherein the substrate conveyance part comprises:

a first substrate conveyance part configured to transfer the substrate to the first transfer part; and a second substrate conveyance part configured to receive the substrate from the second transfer part.

11. The coater/developer as claimed in claim 2, wherein the second unit block comprises a shelf unit including the heating module, a plurality of pre-processing modules configured to process the substrate before the development, and a plurality of post-processing modules configured to process the substrate after the development, the shelf unit is provided so that the shelf unit faces the development module across the conveyance path of the substrate of the second unit block, and the heating module is provided so that the part of the conveyance path of the substrate formed by the conveyance path member of the heating module is along the conveyance path of the substrate of the second unit block, and that the first transfer part and the second transfer part are positioned on a side of the interface block and a side of the carrier block, respectively.

12. The coater/developer as claimed in claim 1, further comprising:

a motor configured to rotate at least one of the rotary bodies so as to cause the timing belts to move along the orbit.

13. The coater/developer as claimed in claim 1, further comprising:

a motor magnet for causing the timing belts of the conveyance path member to move along the orbit, the motor magnet having north and south poles alternately arranged and having a polarity thereof switched, wherein the timing belts have electromagnets provided on at least exterior surfaces thereof, the electromagnets having north and south poles alternately arranged.

14. The coater/developer as claimed in claim 1, wherein the heating part comprises:

a first heat plate provided below the conveyance path member so as to heat the substrate from a lower side thereof; and a second heat plate provided to face the first heat plate so as to heat the substrate from an upper side thereof.

15. The coater/developer as claimed in claim 14, further comprising:

a gas ejection part provided on one of lateral sides of the conveyance path member in a moving direction thereof and configured to form gas flow wide enough to cover a width of the substrate by ejecting gas into a space between the first heat plate and the second heat plate; and a suction exhaust part provided on another one of the lateral sides of the conveyance path member in the moving direction thereof so as to be wide enough to cover the width of the substrate and configured to suction the gas from the space between the first heat plate and the second heat plate.

16. The coater/developer as claimed in claim 1, wherein the substrate conveyance part comprises:

a first substrate conveyance part configured to transfer the substrate to the first transfer part; and a second substrate conveyance part configured to receive the substrate from the second transfer part.

17. The coater/developer as claimed in claim 1, wherein the second unit block comprises a shelf unit including the heating module, a plurality of pre-processing modules configured to process the substrate before the development, and a plurality of post-processing modules configured to process the substrate after the development, the shelf unit is provided so that the shelf unit faces the development module across the conveyance path of the substrate of the second unit block, and the heating module is provided so that the part of the conveyance path of the substrate formed by the conveyance path member of the heating module is along the conveyance path of the substrate of the second unit block, and that the first transfer part and the second transfer part are positioned on a side of the interface block and a side of the carrier block, respectively.

18. A coating and developing method forming a coating film on a substrate in a first unit block provided at a stage subsequent to a carrier block into which the substrate has been carried with a carrier; thereafter conveying the substrate to an exposure unit through an interface block provided at a stage subsequent to the first unit block; performing development in a second unit block on the substrate subjected to exposure in the exposure unit and returned therefrom through the interface block, and transferring the substrate to the carrier block, the second unit block being stacked on the first unit block and having a conveyance path of the substrate from the interface block to the carrier block, wherein:

the second unit block includes a development module configured to perform the development on the substrate, a heating module configured to heat the substrate before and after the development, a cooling module configured to cool the substrate after the heating, and a substrate conveyance part configured to transfer the substrate to and receive the substrate from the modules, the heating module includes a pair of rotary bodies configured to rotate about respective horizontal axles, the rotary bodies being spaced apart from each other in a direction along the conveyance path of the substrate so that the rotational axles thereof are parallel to each other; and a conveyance path member engaged with and extended between the rotary bodies so as to move along an orbit, the conveyance path member forming a part of the conveyance path of the substrate placed on the conveyance path member, and the coating and developing method comprises the steps of:

transferring the substrate from the substrate conveyance part onto the conveyance path member through a first transfer part provided at an upstream end of the conveyance path;

heating the substrate while moving the substrate to a downstream side with the conveyance path member;

moving the substrate to a second transfer part provided at a downstream end of the conveyance path and transferring the substrate from the conveyance path member to the substrate conveyance part; and causing the conveyance path member without the substrate placed thereon to move along the orbit to return from the second transfer part to the first transfer part.

19. The coating and developing method as claimed in claim 18, wherein the substrate conveyance part comprises a first substrate conveyance part and a second substrate conveyance part; and transfers the substrate from the first substrate conveyance part to the conveyance path member in the first transfer part, and transfers the substrate from the conveyance path member to the second substrate conveyance part in the second transfer part.

20. A storage medium storing a computer program used in a coater/developer forming a coating film on a substrate received from a carrier block and performing development on the substrate after exposure, wherein the program contains a group of steps so as to execute the coating and developing method as set forth in claim 18.

* * * * *